US008834091B2

(12) United States Patent
Jin et al.

(10) Patent No.: US 8,834,091 B2
(45) Date of Patent: Sep. 16, 2014

(54) SYSTEM AND METHOD USING MULTIPLE COMPONENT PANE HANDLERS CONFIGURED TO HANDLE AND TRANSFER COMPONENT PANES

(75) Inventors: Jian Ping Jin, Singapore (SG); Lee Kwang Heng, Singapore (SG)

(73) Assignee: Semiconductor Technologies & Instruments Pte Ltd, Singapore (SG)

( * ) Notice: Subject to any disclaimer, the term of this patent is extended or adjusted under 35 U.S.C. 154(b) by 270 days.

(21) Appl. No.: 13/470,369

(22) Filed: May 14, 2012

(65) Prior Publication Data
US 2012/0288352 A1    Nov. 15, 2012

(30) Foreign Application Priority Data

May 12, 2011  (SG) ................................ 201103418-8
May 12, 2011  (SG) ................................ 201103422-0
May 12, 2011  (SG) ................................ 201103425-3

(51) Int. Cl.
*G06F 7/00*    (2006.01)
*H01L 21/683*  (2006.01)
*H01L 21/677*  (2006.01)
*H01L 21/687*  (2006.01)

(52) U.S. Cl.
CPC ...... *H01L 21/68707* (2013.01); *H01L 21/6838* (2013.01); *H01L 21/67766* (2013.01); *H01L 21/67778* (2013.01)

USPC ........ 414/751.1; 700/218; 700/213; 700/219; 700/220; 700/228

(58) Field of Classification Search
None
See application file for complete search history.

(56) References Cited

U.S. PATENT DOCUMENTS

| | | | |
|---|---|---|---|
| 2002/0089655 A1* | 7/2002 | Kida et al. | 355/72 |
| 2009/0051370 A1* | 2/2009 | Doki et al. | 324/658 |
| 2010/0130105 A1* | 5/2010 | Lee | 451/41 |
| 2010/0329827 A1* | 12/2010 | Hoey et al. | 414/217 |

* cited by examiner

*Primary Examiner* — Yolanda Cumbess
(74) *Attorney, Agent, or Firm* — Horizon IP Pte. Ltd.

(57) ABSTRACT

A system and method for transferring component panes from a component pane storage station to a vacuum table assembly are disclosed. The system includes a number of component pane handlers, for instance two handlers, and a pick and place mechanism or arm. The handler transfers the component panes from the station to the mechanism. The system includes an alignment module configured to facilitate spatial alignment of the component pane while the component pane is coupled to the handler. The module can be carried by the mechanism. Spatial alignment of the component pane can be substantially completed before transfer of the component pane from the handler to the mechanism. The mechanism includes a set of vacuum elements or pads that enables pick up of the component pane from the handler as well as release and pick up of the component pane at the vacuum table assembly.

26 Claims, 28 Drawing Sheets

SYSTEM AND METHOD USING MULTIPLE COMPONENT PANE HANDLERS CONFIGURED TO HANDLE AND TRANSFER COMPONENT PANES

TECHNICAL FIELD

The present disclosure relates generally to systems and methods for handling, transferring, and/or aligning film frames and any component(s) carried thereby. More specifically, the present disclosure relates to a system and method that uses multiple robotic film frame handlers for retrieving film frames and any component(s) carried thereby from a film frame loading station and transferring said film frames and any component(s) carried thereby to another location, station, substation, or system element, structure, or component. The film frames and any component(s) carried thereby can be spatially aligned external to the film frame loading station and while carried by or coupled to the film frame handlers.

BACKGROUND

Over the past several decades, the use of and demand for semiconductor components or semiconductor-related components have significantly increased. This rapid increase in the demand for semiconductor components can be largely attributed to individuals' and businesses' desire for computers and other electronic products, more specifically faster, higher quality, more reliable, and/or more advanced computers and electronic products.

The manufacture of semiconductor components typically includes one or more inspection processes for determining and/or ensuring the quality of manufactured semiconductor components. The inspection of semiconductor components (e.g., film frames carrying whole, partial, or diced wafers) typically involves capture of images of the semiconductor components and processing the captured images to thereby detect defects that may be present on the semiconductor components.

Generally, semiconductor components need to be transferred and placed onto a displaceable table, for instance a vacuum table or chuck, before images of the semiconductor components are captured using an optical inspection apparatus. The vacuum table is typically displaced along Cartesian coordinates to enable displacement of the semiconductor component placed thereon such that images of different portions or areas of the semiconductor component can be captured.

To ensure effectiveness and/or accuracy in the inspection process of semiconductor components, the semiconductor components need to be spatially aligned prior to inspection (e.g., image capture) thereof. Therefore, semiconductor components need to be spatially aligned when placed or disposed on the vacuum table.

There are several existing methods, techniques, and/or apparatuses that facilitate spatial alignment of semiconductor components when said semiconductor components are placed on vacuum tables. For instance, sensor(s) and/or alignment element(s) can be carried by or coupled to the vacuum table to facilitate or effectuate semiconductor component (e.g., film frames and any component(s) carried thereby) alignment on the vacuum table. However, such sensors and alignment elements can increase complexity and/or cost of manufacture of the vacuum tables.

Many existing semiconductor vacuum tables or chucks carry or include ejector pin(s) that are configured and/or positioned to movably extend above the plane or surface of the vacuum table. The ejector pins can be extended a given distance above the surface of the vacuum table to receive the film frames and any component(s) carried thereby, for instance from a robotic handler, arm, or like transfer mechanism. After receiving the semiconductor component, the ejector pins can be lowered to a level at or just below the surface of the vacuum table in order to place or rest the semiconductor component on the surface of the vacuum table. The ejector pins can also be used to spatially align the semiconductor component on the vacuum table, for instance in relation to alignment markers or structures that are carried by the vacuum table. For allowing or facilitating subsequent removal or pick up of the semiconductor component from the vacuum table, the ejector pins can be extended to thereby lift or raise the semiconductor component a distance above the surface of the vacuum table such that the semiconductor component can be picked up by a robotic handler, arm, or like transfer mechanism.

There have been efforts (e.g., research and development efforts) to explore ways, methods, and techniques for increasing throughput or efficiency of systems involved in inspection of semiconductor components. For instance, increasing the speed or rate at which semiconductor components can be transferred to and from a vacuum table can help to increase overall semiconductor component inspection speed. However, many existing methods and techniques for increasing the speed associated with transfer of semiconductor components (e.g., transfer of semiconductor components onto a vacuum table) also increases the complexity and/or cost of manufacturing and/or operating the system associated with said transfer and inspection of semiconductor components.

The use of ejector pins with many conventional vacuum tables is also associated with a number of limitations. Ejector pins typically need to be positioned at different distances relative to each other for accommodating different sizes of semiconductor components (e.g., six-inch film frames, eight-inch film frames, and twelve-inch film frames). As a result, vacuum tables commonly require multiple sets of ejector pins, that is, a separate set of ejector pins for each size of semiconductor component (e.g., film frame) that the vacuum table is designed to carry. This increases complexity and cost of manufacturing associated with said vacuum table. In addition, ejector pins typically introduce gaps or openings on the vacuum table, thereby reducing the suction capability and/or vacuum uniformity on one or more portions of the vacuum table. In addition, when not properly (e.g., fully) retracted into the vacuum table, the ejector pins can cause unwanted damage or defects to film frames and any component(s) carried thereby.

Existing systems, apparatuses, and methods for handling and/or transferring film frames and any component(s) carried thereby have associated limitations, disadvantages, and/or problems. While improvements to semiconductor component manufacturing have been made, there continues to be a demand for simpler, more efficient, and more cost effective semiconductor component manufacturing (e.g., semiconductor component handling, transferring, alignment, and/or inspections) systems, methods, and techniques.

SUMMARY

In accordance with a first embodiment of the present disclosure, there is disclosed a system for handling film frames. The system includes a plurality of component pane handlers wherein each component pane handler of the plurality of component pane handlers is configured to retrieve a component pane from a component pane storage station. Each component pane handler of the plurality of component pane handlers includes an end effector configured to carry the component pane. In addition, each component pane handler of the plurality of component pane handlers includes a registration element adapted to engage with the component pane carried by the end effector. The system also includes an alignment module situate in a position external to the component pane storage station. The alignment module and each end effector carrying the component pane is displaceable relative to one and the other such that a portion of the extremity of the component pane contacts the alignment module in a manner that one of facilitates and effectuates application of force onto the component pane carried by said end effector. The application of force onto the component pane causes a displacement of the component pane such that a portion of the extremity of the component pane engages with the registration element carried by the end effector.

In accordance with a second embodiment of the present disclosure, there is disclosed a system for handling film frames. The system includes a first film frame handler configured to retrieve a first film frame from a film frame storage station. The first film frame handler includes a first end effector configured to carry the first film frame, and a first registration element adapted to engage with at least one registration groove of the first film frame carried by the first end effector. The system also includes a pick and place mechanism located external to the film frame storage station and configured to lift the first film frame from the first end effector and to transfer the first film frame from the first end effector to a vacuum table assembly. The pick and place mechanism includes an alignment module that is displaceable relative to the first film frame carried by the first end effector. The relative displacement between the alignment module and the first film frame results in contact between said alignment module and said first film frame to one of effectuate and enhance engagement of a portion of the extremity of the first film frame to the first registration element to thereby effectuate spatial alignment of the first film frame.

In accordance with a third embodiment of the present disclosure, there is disclosed a method for transferring film frames. The method including retrieving a first film frame from a film frame storage station by a first end effector. The first end effector is configured to carry the first film frame. The first end effector includes a first registration element adapted to engage to the first film frame carried by the first end effector. The method also includes displacing the first end effector to correspondingly displace the first film frame carried thereby towards an alignment module that is situated in a position external to the film frame storage station. In addition, the method also includes effectuating contact between the first film frame carried by the first end effector and the alignment module and applying a force to the first film frame in association with the contact effectuated between a portion of the extremity of the first film frame and the alignment module. The force applied to the first film frame in association with the contact effectuated between the portion of the extremity of the first film frame and the alignment module one of effectuates and enhances engagement of the first film frame to the first registration element and hence effectuates spatial alignment of the first film frame carried by the first end effector.

In accordance with a fourth embodiment of the present disclosure, there is disclosed a method for position alignment of component panes. The method includes retrieving a plurality of component panes from a component pane storage station using a plurality of end effectors. Each end effector of the plurality of end effectors includes a registration element that is adapted to engage with the component pane retrieved thereby. The method also includes displacing each end effector of the plurality of end effectors in a controlled sequential manner relative to an alignment module located external to the component pane storage station. The displacement of each end effector correspondingly displaces the component pane carried thereby relative to the alignment module. In addition, the method includes applying a force onto the component pane carried by each end effector of the plurality of end effectors in a controlled sequential manner by the alignment module to thereby one of effectuate and enhance engagement of said component pane to the registration element of said end effector. The effectuation and enhancement of engagement between said component pane and the registration element effectuates spatial alignment of said component pane in a manner that removes a need for further spatial alignment of said component pane.

BRIEF DESCRIPTION OF THE DRAWINGS

Embodiments of the present disclosure are described hereinafter with reference to the drawings, in which.

DETAILED DESCRIPTION

Figure 1:
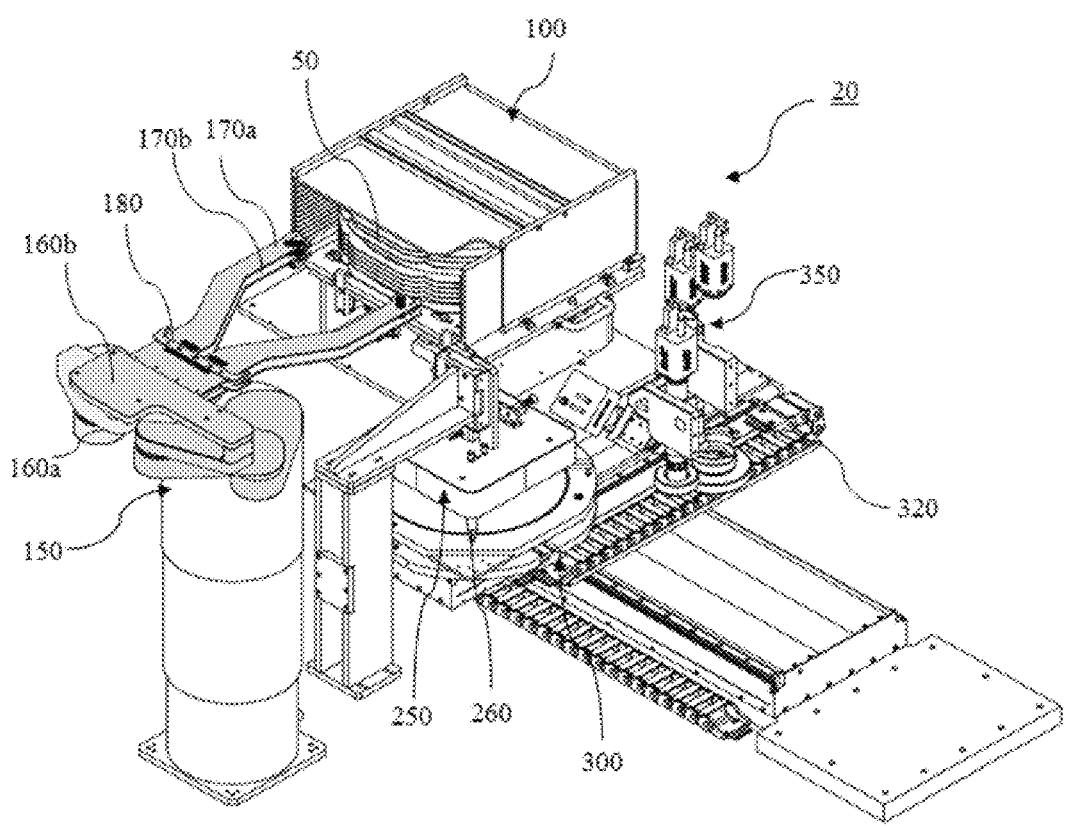
FIG. 1 is a schematic illustration of a system for handling, transferring, aligning, and inspecting component panes, for instance film frames, according to an embodiment of the present disclosure.

Embodiments of the present disclosure relate to systems, devices, apparatuses, methods, processes, and/or techniques for handling, transferring, and/or aligning components, component carriers, component panes, or component frames. In various embodiments in accordance with the present disclosure, the term "component pane" encompasses a device, apparatus, structure, or member such as a frame or chassis that can carry, support, hold, retain, or at least partially surround, enclose, or define a border relative to a peripheral portion of a component such as a semiconductor wafer or similar type of substrate. A component pane can provide or enable the provision of one or more surfaces (e.g., flat of substantially flat surfaces) that can carry (e.g., by way of a tensioned sheet of material such as an adhesive film) a portion of a component such as a semiconductor wafer. In representative embodiments, component panes can be film frames. In some embodiments, the term "component panes" can also encompass substrates themselves, such as wafers, solar panels, or electrical components such as printed circuit boards.

For purposes of brevity and clarity, the following description of the systems, devices, apparatuses, methods, process, and/or techniques of various embodiments of the present disclosure is provided with particular reference to film frames. However, it will be understood that other components, component carriers, or component panes, for instance packaged semiconductor components or devices, electronic components such as printed circuit boards, and solar cells or modules or solar panels shaped like a wafer, can also be handled, transferred, and/or aligned in association with the systems, devices, apparatuses, methods, processes, and techniques of various embodiments the present disclosure.

The system includes a component pane transfer module (also known as a component frame transfer module), for example a film frame transfer module, which includes a plurality of component pane handlers or component frame handlers, for example film frame handlers, that are configured to couple to, carry, handle, and/or transfer component planes or component frames, for example film frames, and any component(s) carried thereby. Each component pane handler of the plurality of component pane handlers can be a robotic arm that is configured to have one or more of x-axis, y-axis, z-axis, and θ-axis motion. In many embodiments, the component pane transfer module includes at least two component pane handlers configured to retrieve component panes from a component pane storage station (or a component pane loading and unloading module, cassette, or rack or film frame storage module) and transfer said retrieved component panes from the component pane storage station to another location, system element, or device, for instance to a pick and place mechanism or arm. The use of multiple component pane handlers for retrieving, handling, and transferring component panes can help to increase the efficiency and/or throughput of the system in relation to the retrieval, handling, and/or transfer of component panes. Relative displacement, position, and/or operation of each component pane handler of the plurality of component pane handlers can be automatically controlled, for instance by way of a computer program software executed by a computing device or system that is coupled to the component pane transfer module. The relative displacement, position, and/or operation of each component pane handler of the plurality of component pane handlers can be synchronized for enhancing overall efficiency of the system.

The system also includes an alignment element, module, device, or structure (e.g., a position alignment element, module, device, or structure). The alignment module comprises at least one alignment element, and in many embodiments two or more alignment elements. The alignment module is configured to facilitate or effectuate positional alignment of component panes and any component(s) carried thereby. The alignment module is positioned or located external to a component pane storage station. In several embodiments, the alignment module is positioned or disposed in a manner that allows, facilitates, or enables easy, convenient, unblocked, and/or unrestricted access to the component pane carried by or coupled to the component pane handler.

The component pane can be spatially aligned by the alignment module while said component pane is being carried by or coupled to the component pane handler. In most embodiments, the component pane handler includes a registration element, module, or structure (hereinafter referred to as a registration element). The registration element is configured to engage to a particular portion of, and more specifically the extremities or edges or sides of, the component pane. An engagement, or an enhanced (e.g., mating, secure, or tight-fit) engagement, between the component pane and the registration element can effectuate, or be associated with, the spatial alignment of the component pane.

In many embodiments, spatial alignment of the component pane can be effectuated by displacing the component pane relative to the alignment module such that the alignment module applies a force to or against a part of the component pane, for instance the extremities or edges or sides of the component pane, to thereby effectuate or enhance an engagement between the component pane and the registration element of the component pane handler. The component pane can be displaced relative to the alignment module, more specifically to or towards the alignment module, such that the alignment module makes contact and/or pushes against the component pane, more specifically an edge, side, extremity, or periphery of the component pane, to thereby effectuate or enhance an engagement between the component pane and the registration element of the component pane handler. The alignment or spatial alignment of the component pane while the component pane is carried by the component pane handler can eliminate or remove, or at least substantially eliminate or remove, a need for position alignment of the component pane subsequent transfer of the component pane to another location, station, sub-station, system element or structure, or device, for instance subsequent a transfer of the component pane to a pick and place mechanism or to a vacuum table of a vacuum table assembly.

The alignment or spatial alignment of the component pane and any component(s) carried thereby (e.g., film frame and any component(s) carried by the film frame) prior to its transfer to a vacuum table assembly eliminates a need for further alignment or substantive alignment of the component pane after the component pane has been transferred to the vacuum table assembly. Such removal of the need for further alignment or substantive alignment of the component pane after the component pane has been transferred to the vacuum table assembly can increase the efficiency, robustness, simplicity of design, and/or cost-effectiveness of systems, device, apparatuses, methods, processes, and/or techniques of many embodiments of the present disclosure.

Representative aspects of systems, devices, apparatuses, processes, methods, and/or techniques for handling component panes or component frames, for example semiconductor-related component panes such as film frames, are described in detail hereinafter with reference to FIG. 1 to FIG. 3B, in which like or analogous elements or process portions are shown numbered with like or analogous reference numerals. Relative to descriptive material corresponding to one or more of FIGS. 1 to 3B, the recitation of a given reference numeral can indicate simultaneous consideration of a FIG. in which such reference numeral was previously shown. The embodiments provided by the present disclosure are not precluded from applications in which particular fundamental structural and/or operational principles present among the various embodiments described herein are desired. In addition, the present disclosure relates to and incorporates in their entirety by reference Singapore patent applications entitled "System And Method For Handling And Aligning Component Panes Such As Film Frames And Wafers" (Singapore Patent Application No. 201103425-3) and "A Component Pane Handler Configured To Handle Component Panes of Multiple Sizes" (Singapore Patent Application No. 201103422-0), each filed 12 May 2011 by Applicant "Semiconductor Technologies and Instruments Pte Ltd".

Aspects of the Representation System Embodiments

Figure 2A:
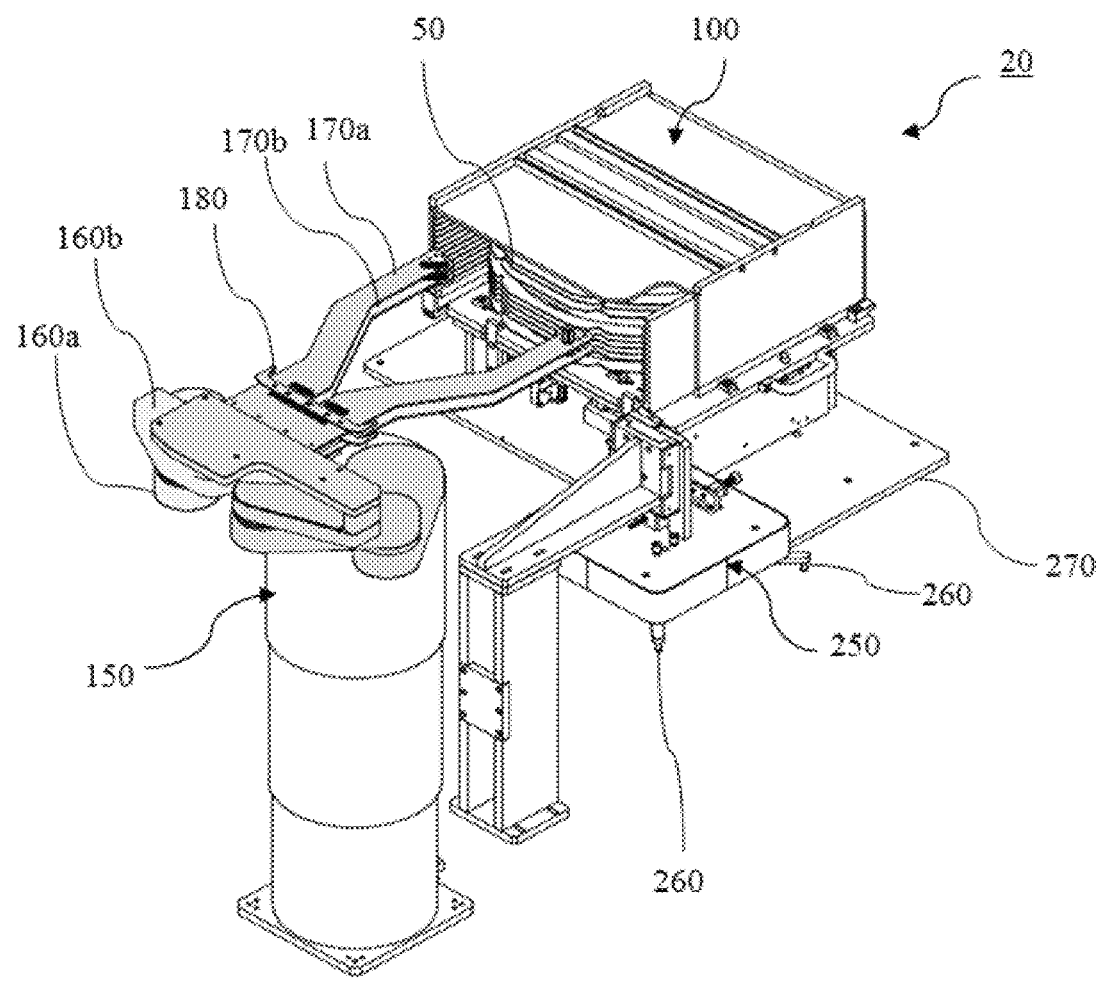
FIG. 2A shows positioning of a first film frame handler and a second film frame handler, more specifically a first end effector and a second end effector, prior to retrieval of film frames from a film frame storage station according to an embodiment of the present disclosure.
Figure 2B:
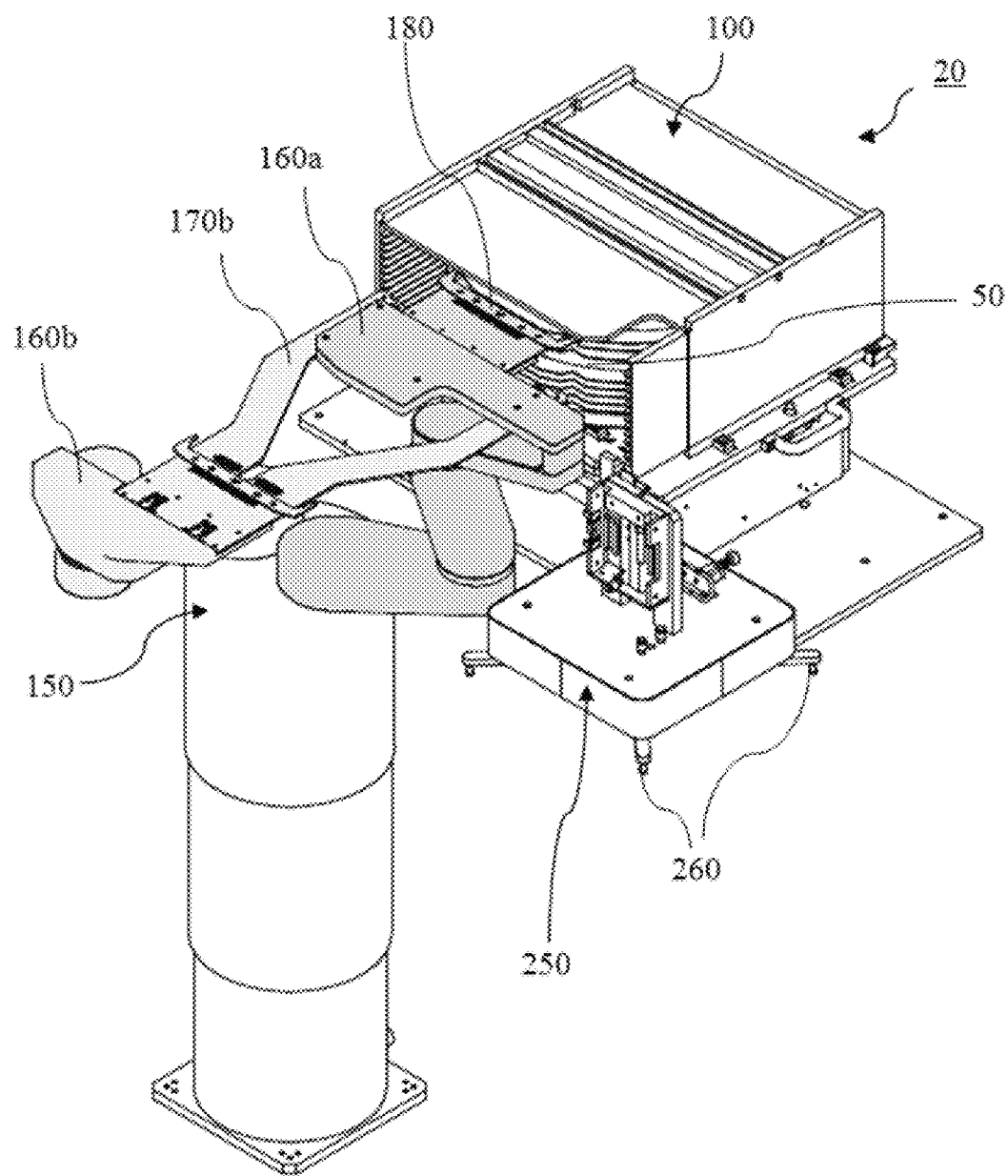
FIG. 2B shows displacement of the first end effector of FIG. 2A to an extended position for retrieving a first film frame from the film frame storage station.
Figure 2C:
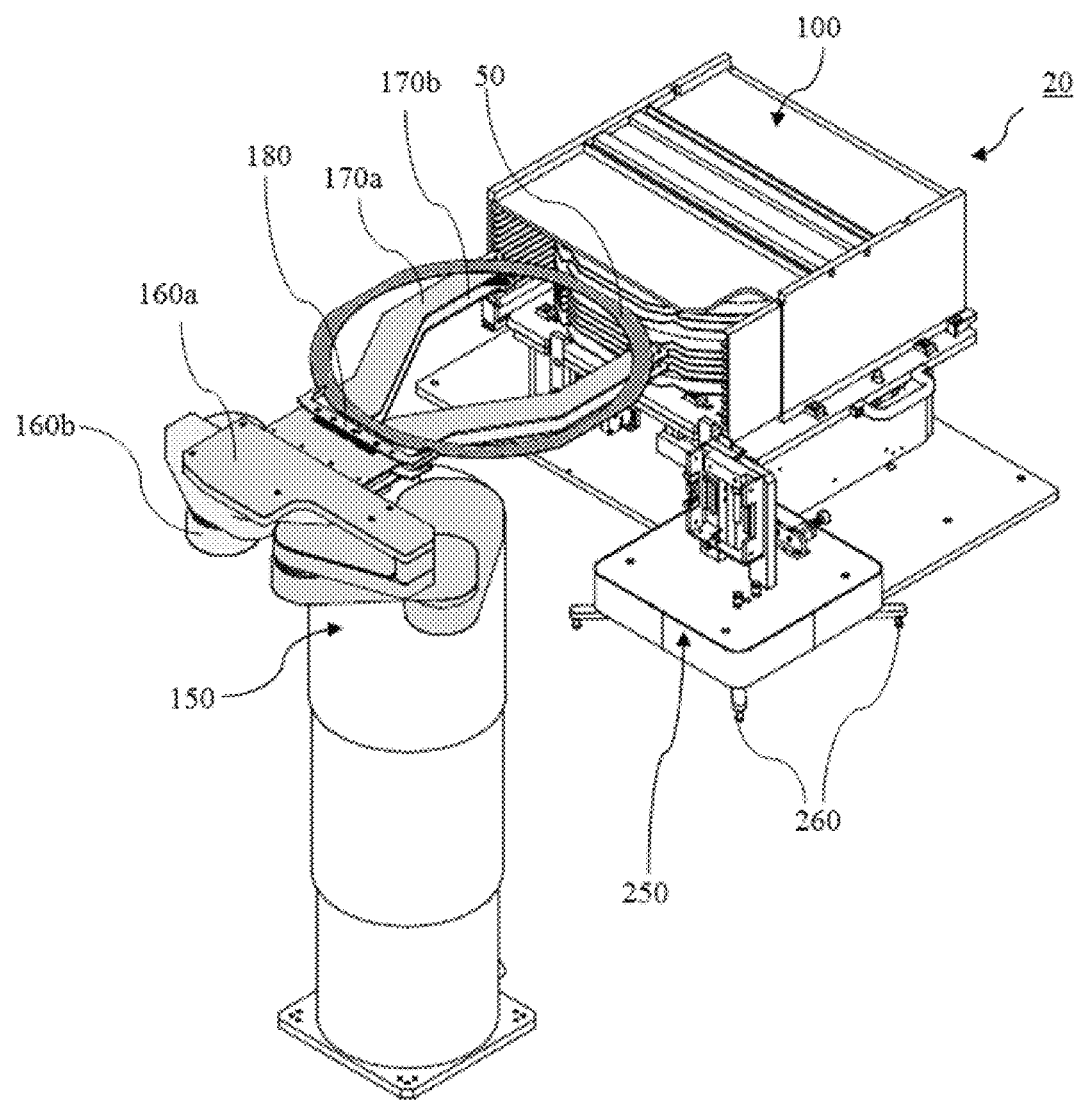
FIG. 2C shows the first film frame carried by the first end effector of FIG. 2B subsequent the retrieval of thereof from the film frame storage station.
Figure 2D:
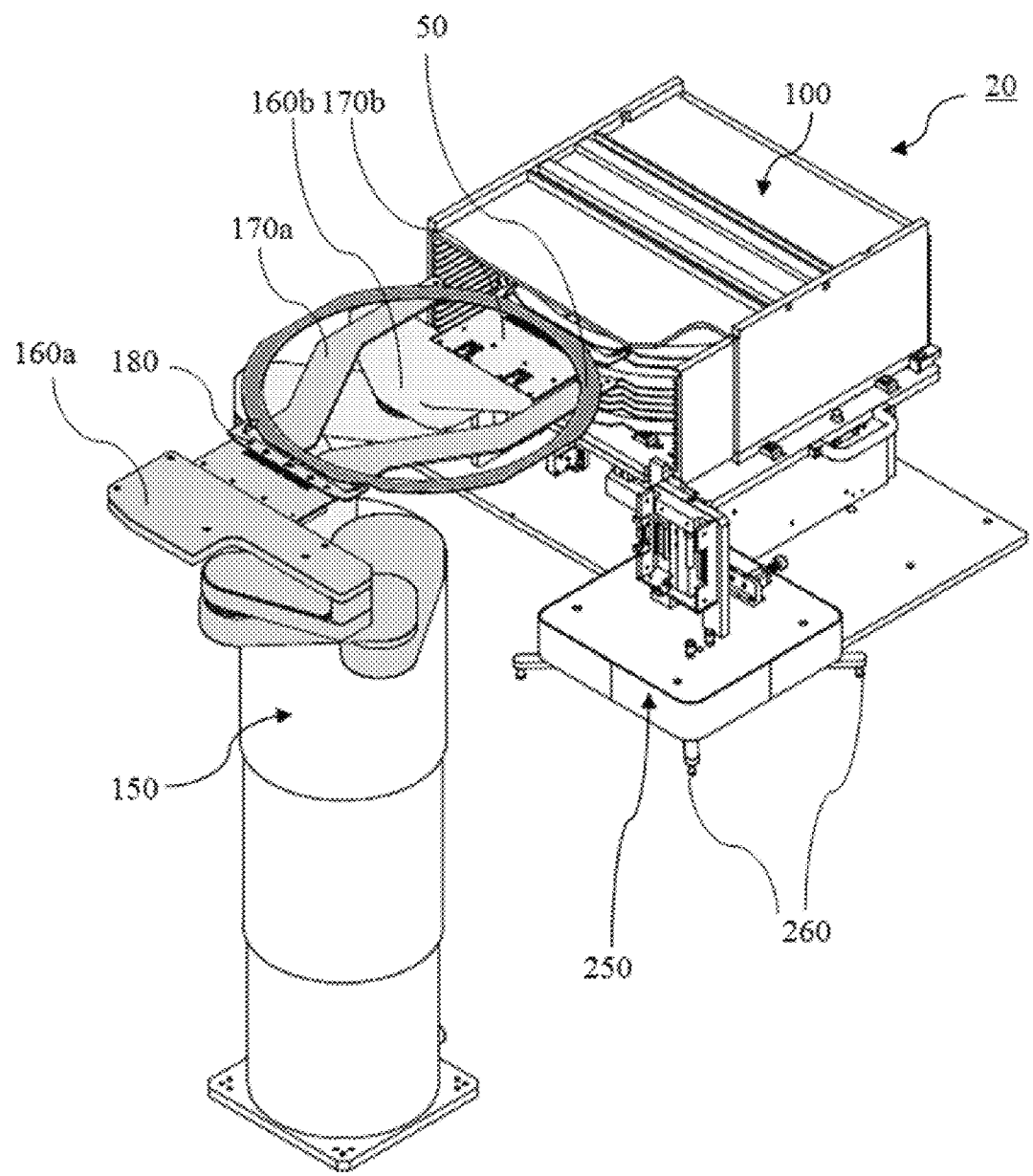
FIG. 2D shows displacement of the second end effector of FIG. 2A to an extended position for retrieving a second film frame from the film frame storage station.
Figure 2E:
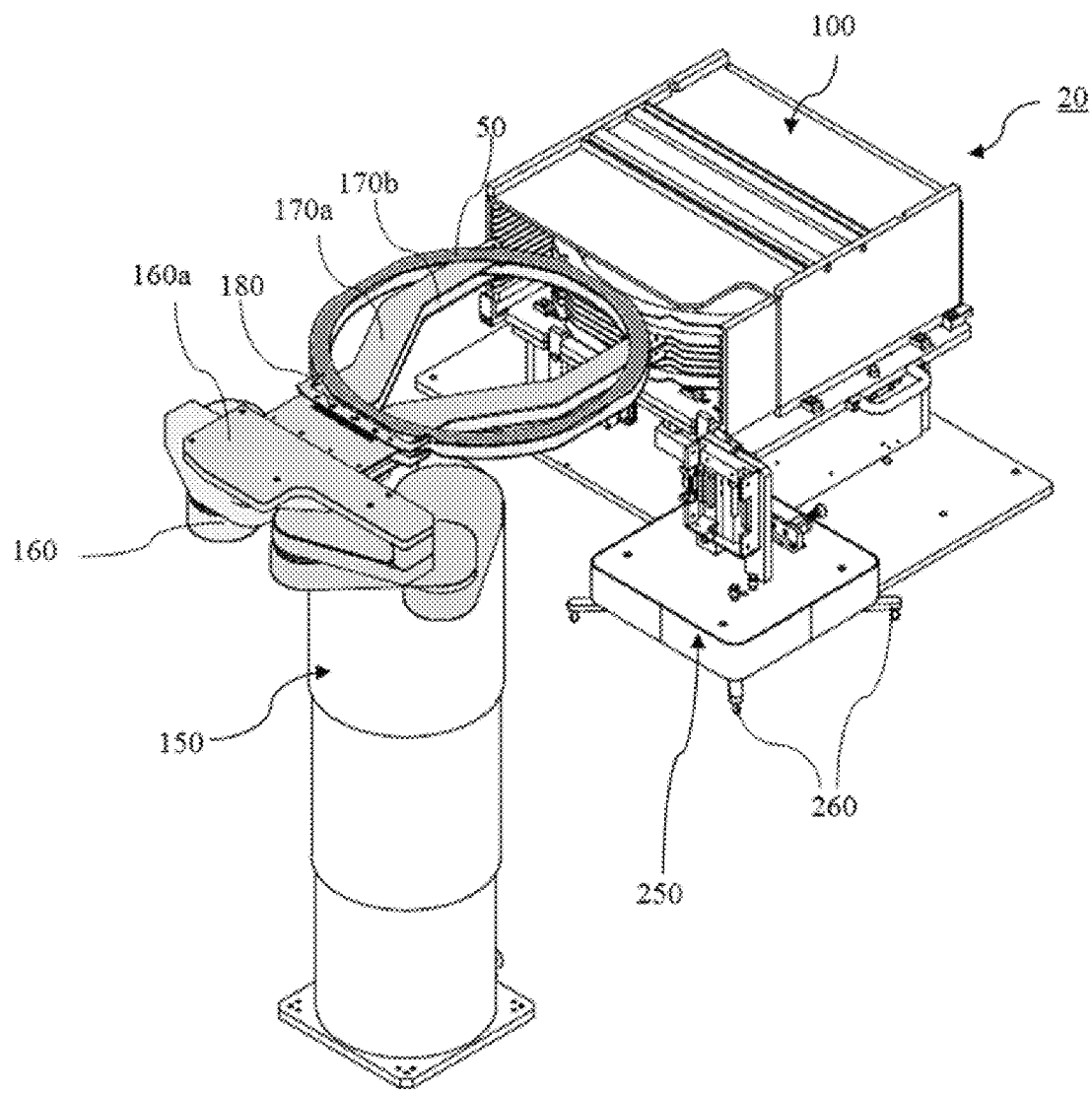
FIG. 2E shows each of the first film frame and the second film frame carried by the first end effector and the second end effector respectively subsequent their retrieval from the film frame storage station.
Figure 2F:
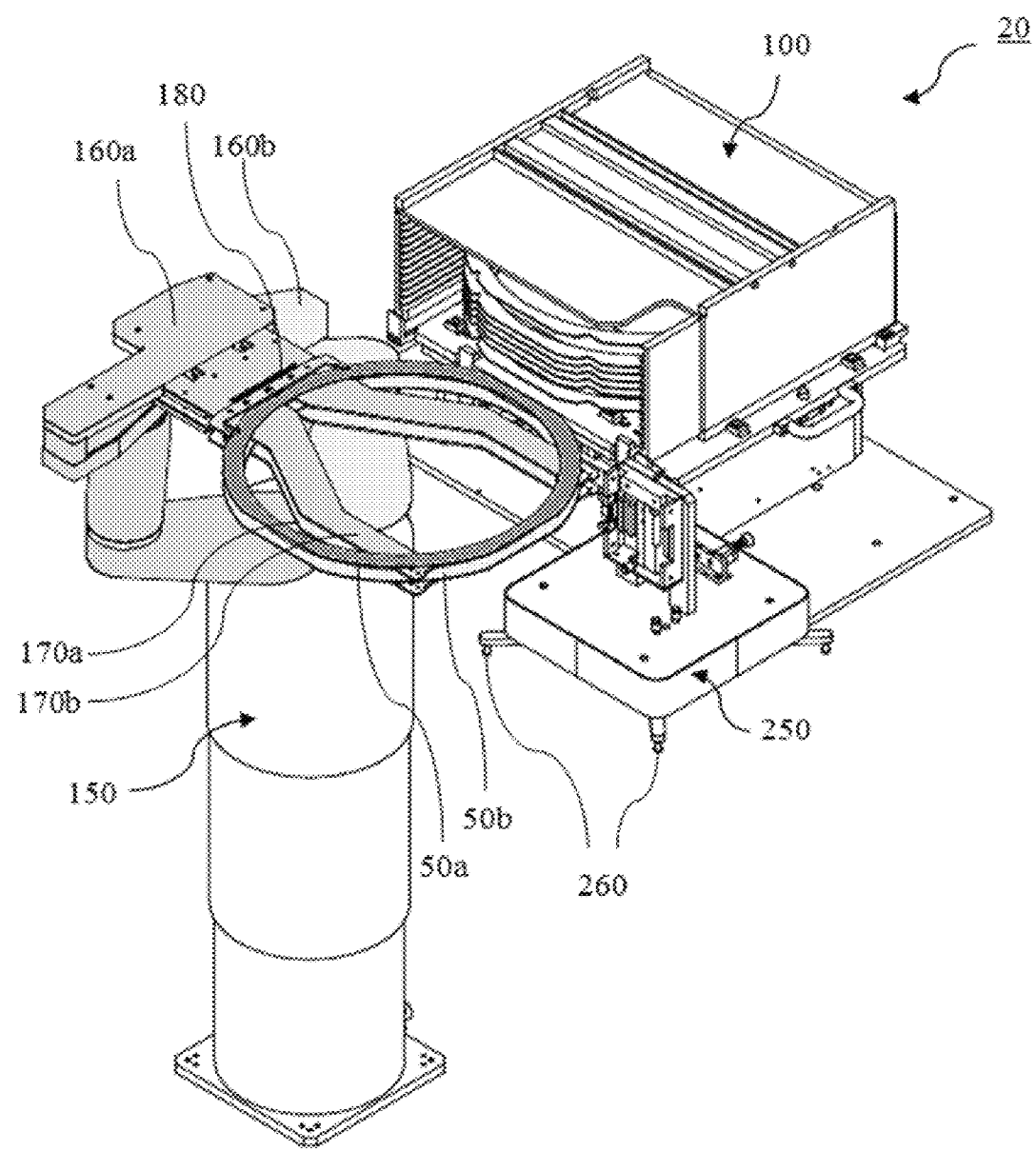
FIG. 2F shows the rotation of each of the first end effector and the second end effector for displacing the first film frame and the second film frame to an intended or target position relative to a pick and place mechanism in accordance with an embodiment of the present disclosure.
Figure 2G:
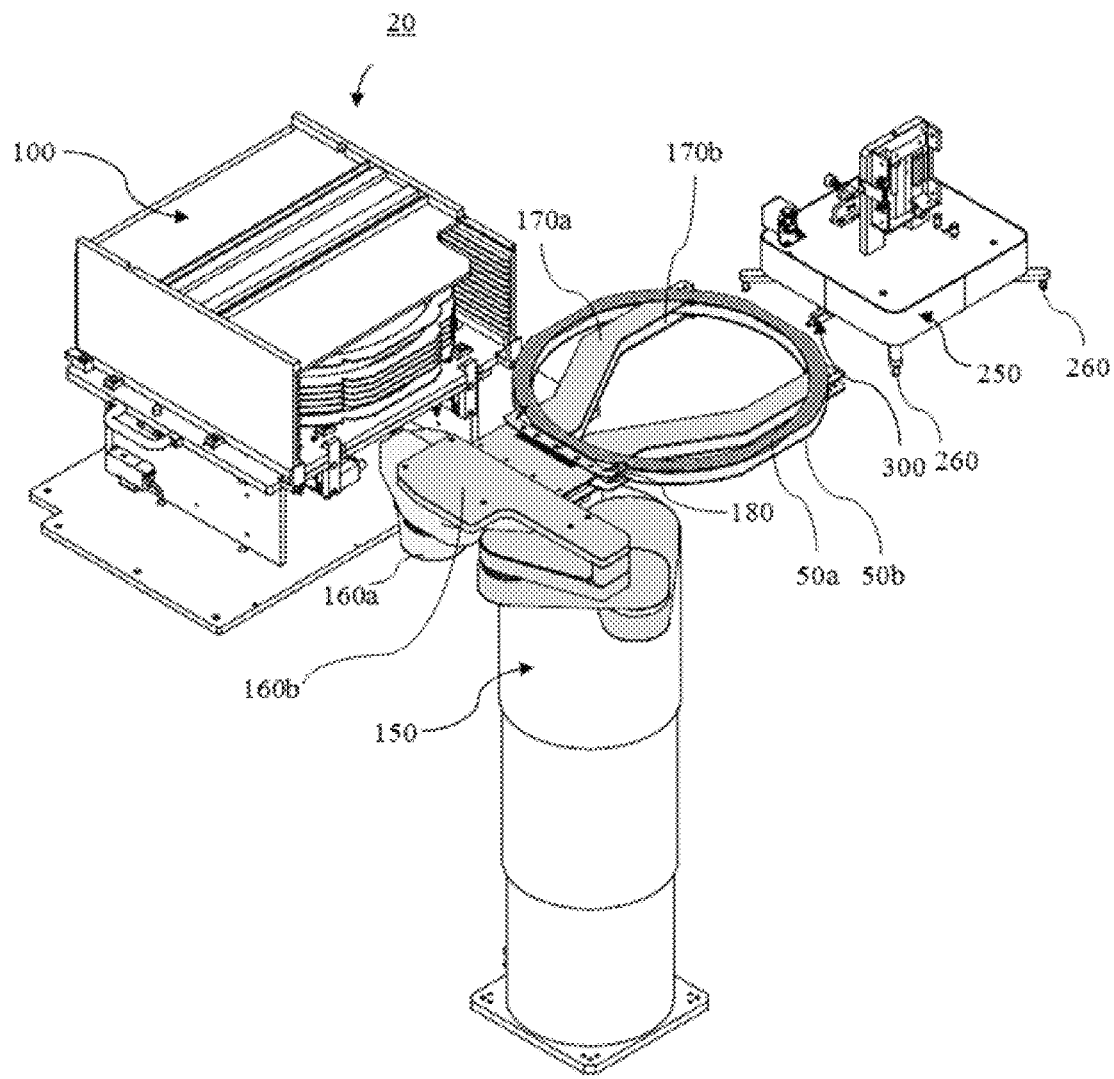
FIG. 2G shows alignment of each of the first film frame and the second film frame relative to an alignment module carried by the pick and place mechanism of FIG. 2F.
Figure 2H:
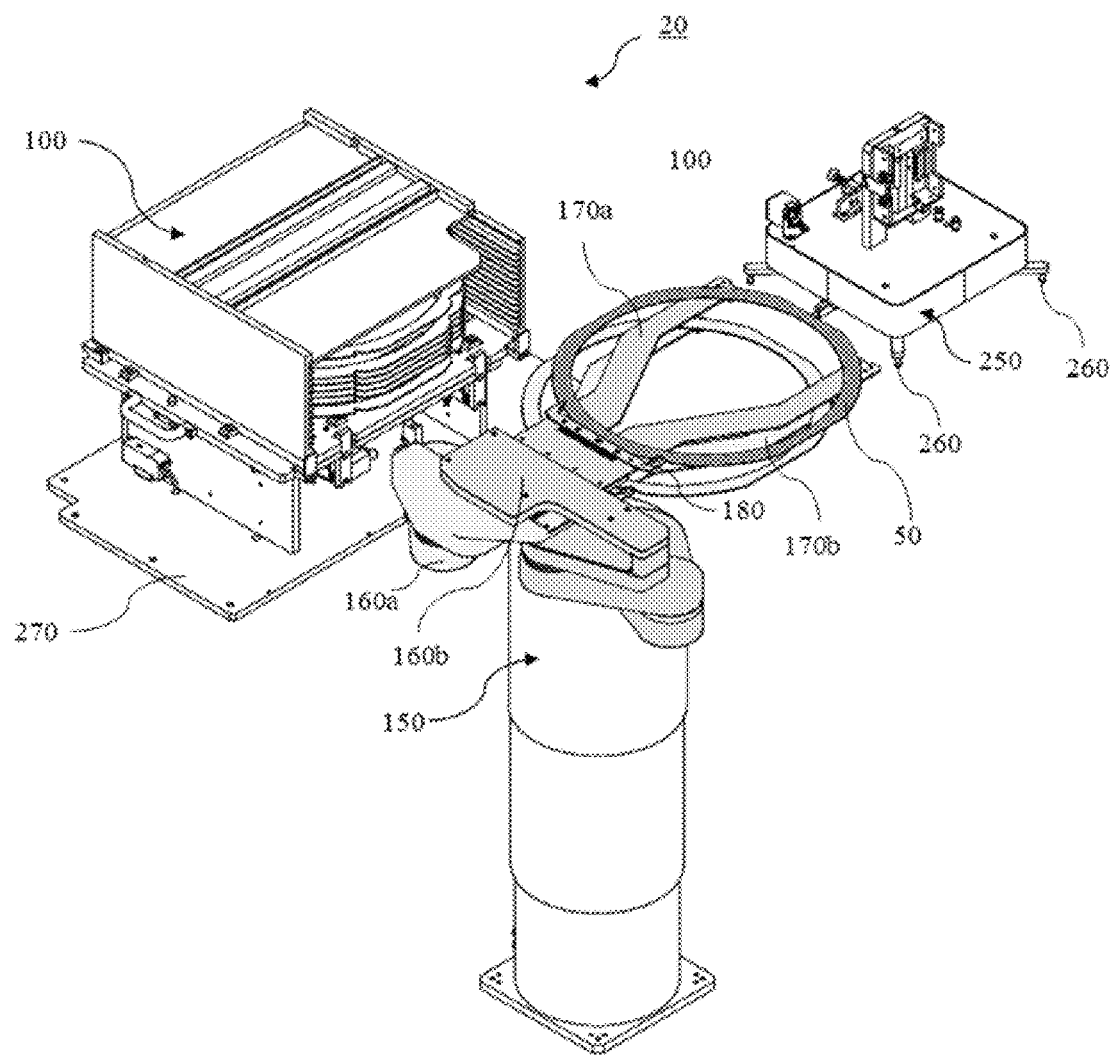
FIG. 2H shows the displacement of the first end effector and corresponding displacement of the first film frame carried thereby towards the alignment module such that the first film frame makes contact with the alignment element of FIG. 2F.
Figure 2I:
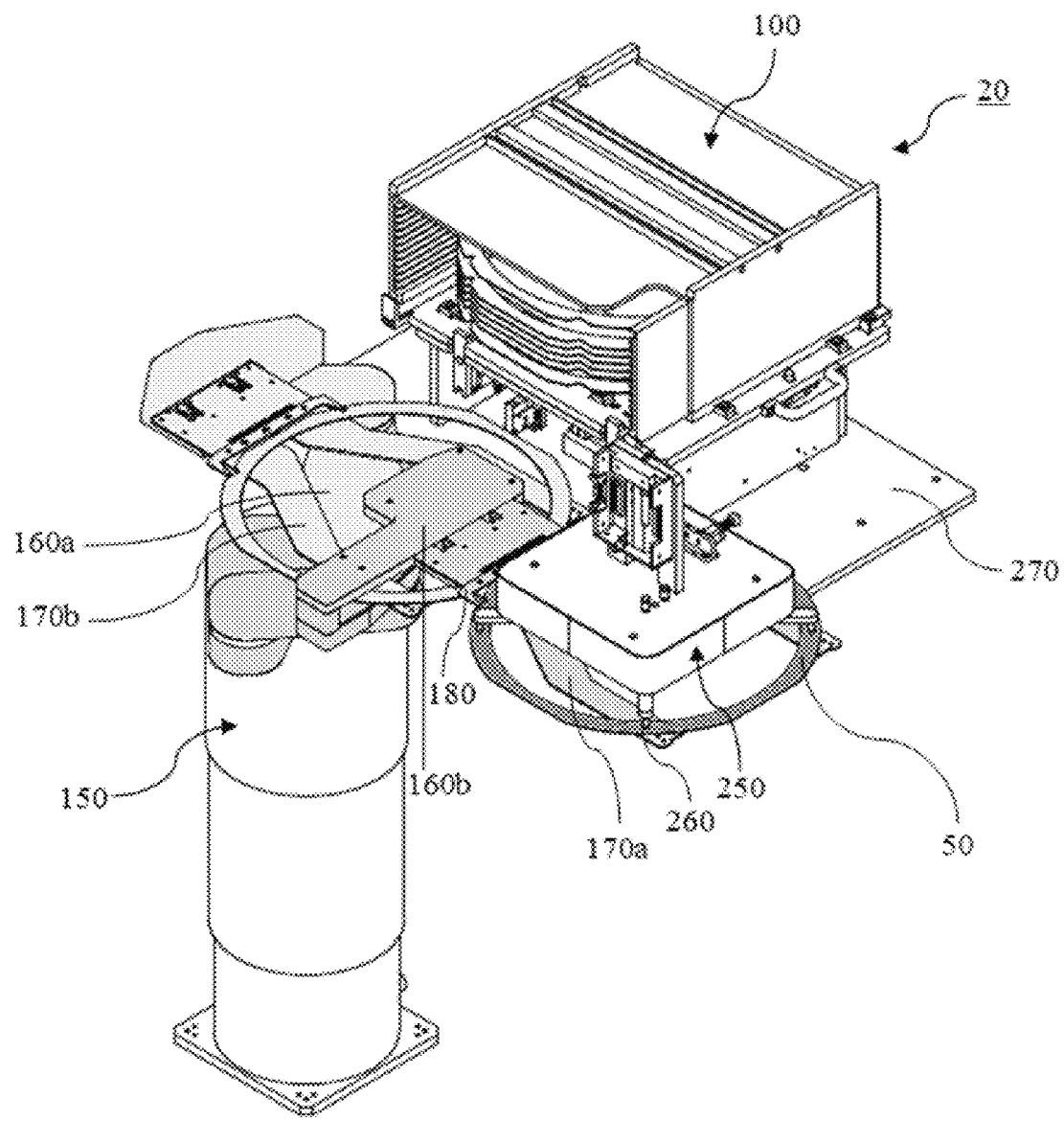
FIG. 2I shows the displacement of the first end effector for positioning the first film frame carried thereby underneath a plurality of suction or vacuum elements of the pick and place mechanism in a manner that facilitates pick up of the first film frame by the pick and place mechanism in accordance with an embodiment of the present disclosure.
Figure 2J:
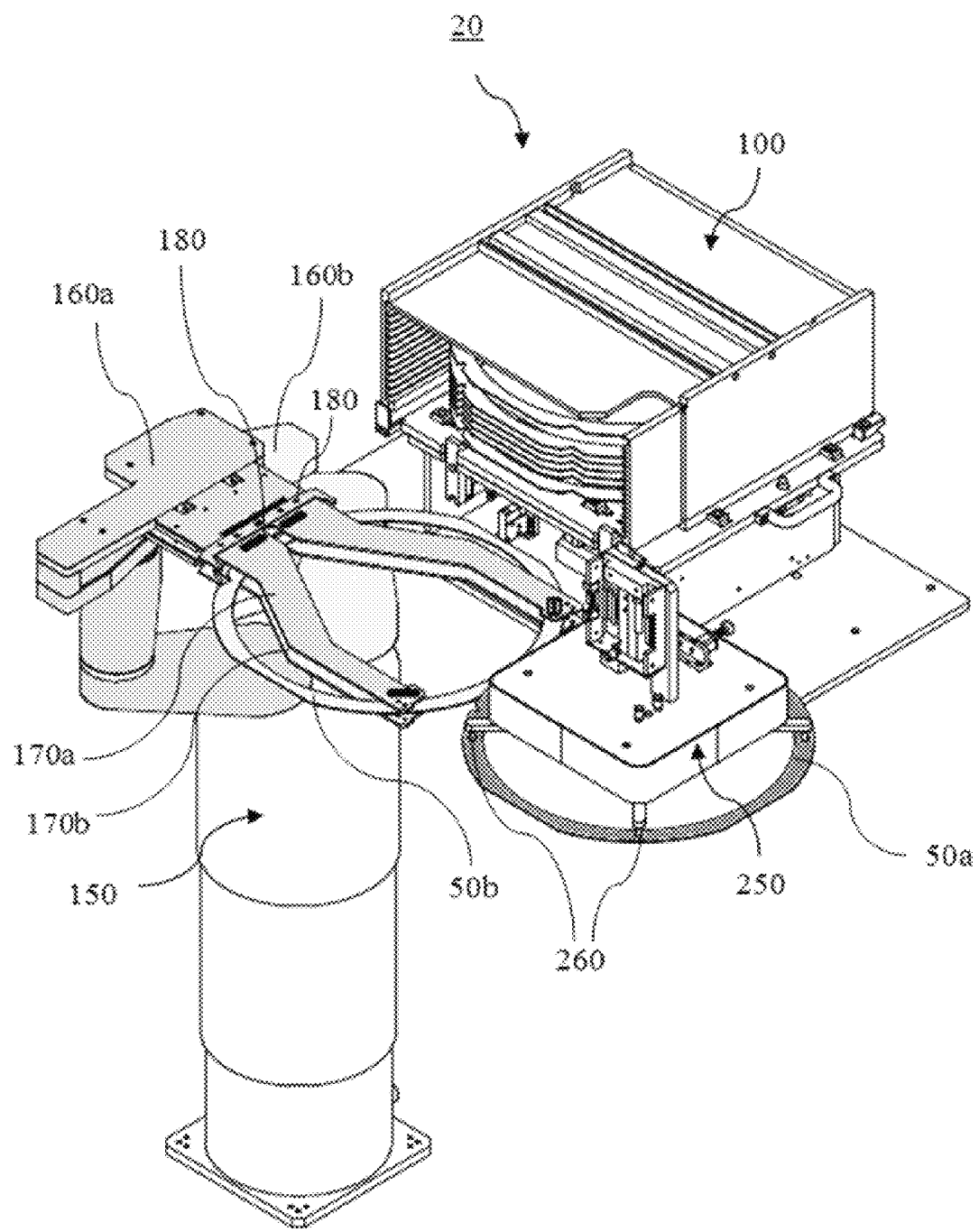
FIG. 2J shows the pick and place mechanism of FIG. 2I carrying the first film frame using the plurality of suction elements of the pick and place mechanism.
Figure 2K:
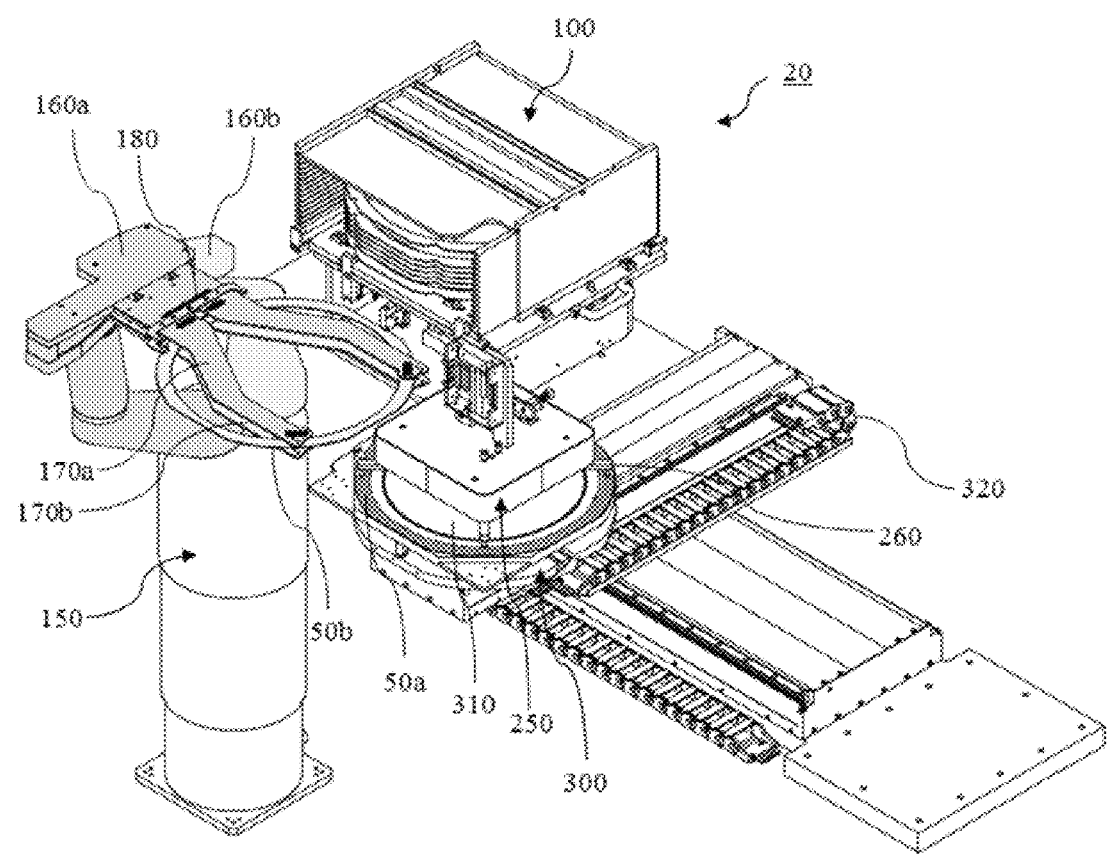
FIG. 2K shows a transfer of the first film frame from the pick and place mechanism onto a vacuum table of a vacuum table assembly in accordance with an embodiment of the present disclosure.
Figure 2L:
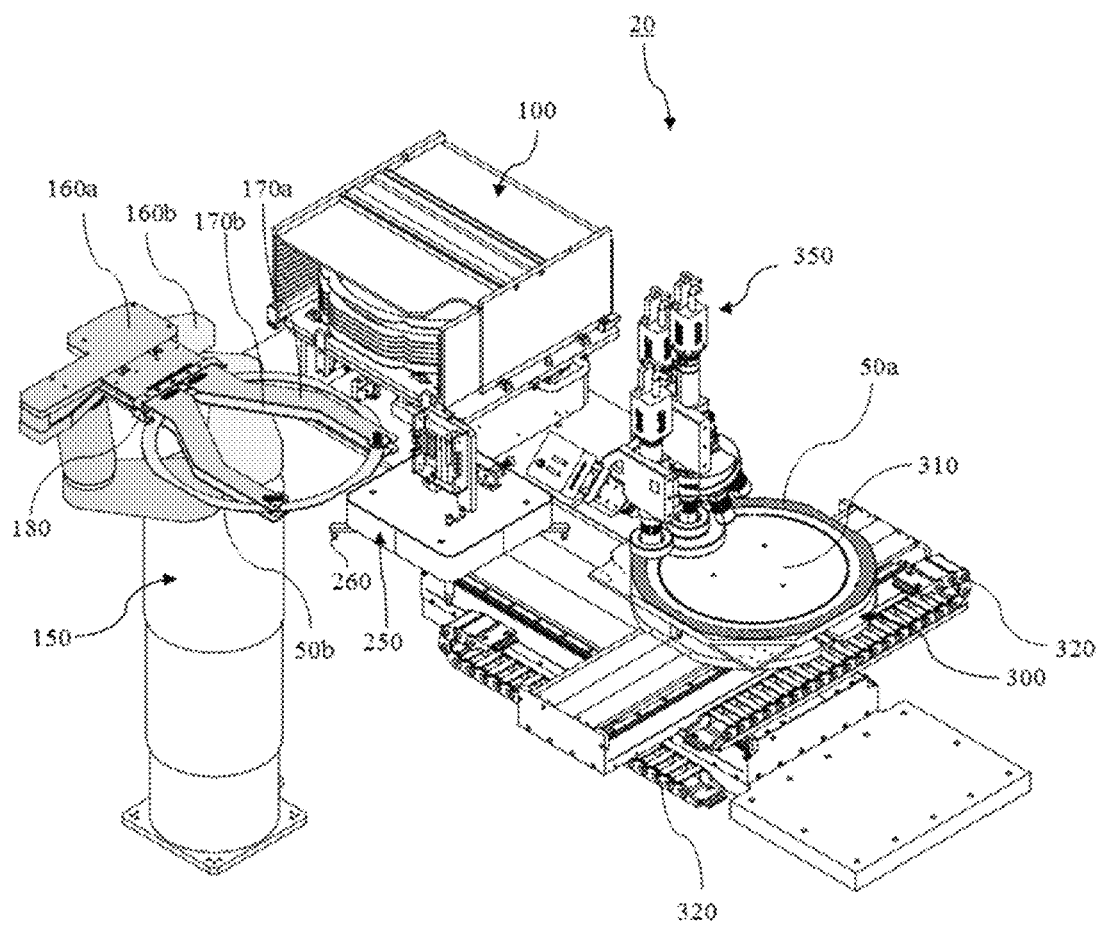
FIG. 2L and FIG. 2M show the translation of the vacuum table relative to an optical inspection apparatus to position the first film frame carried by the vacuum table for image capture by the optical inspection apparatus.
Figure 2M:
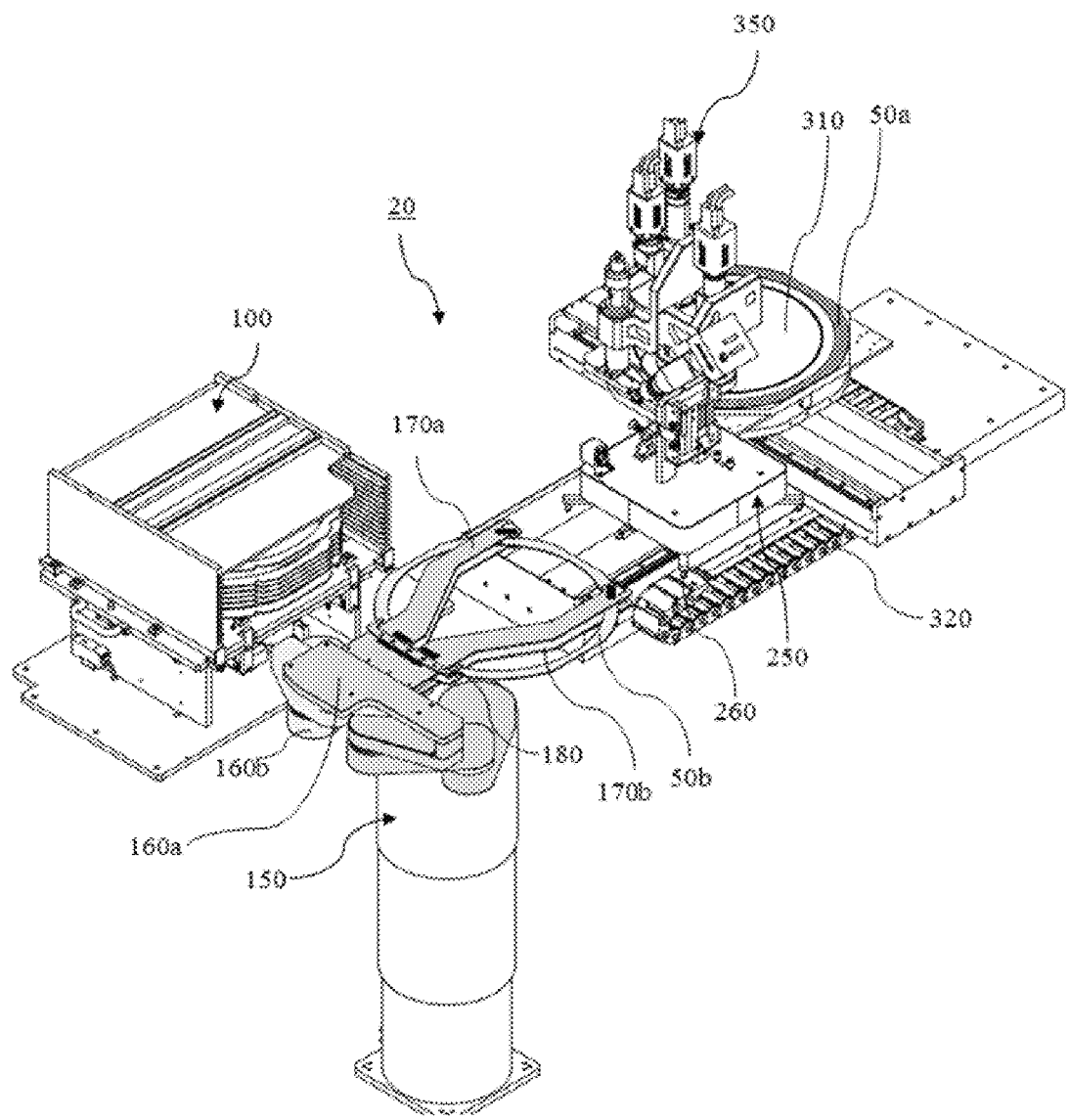
Figure 2N:
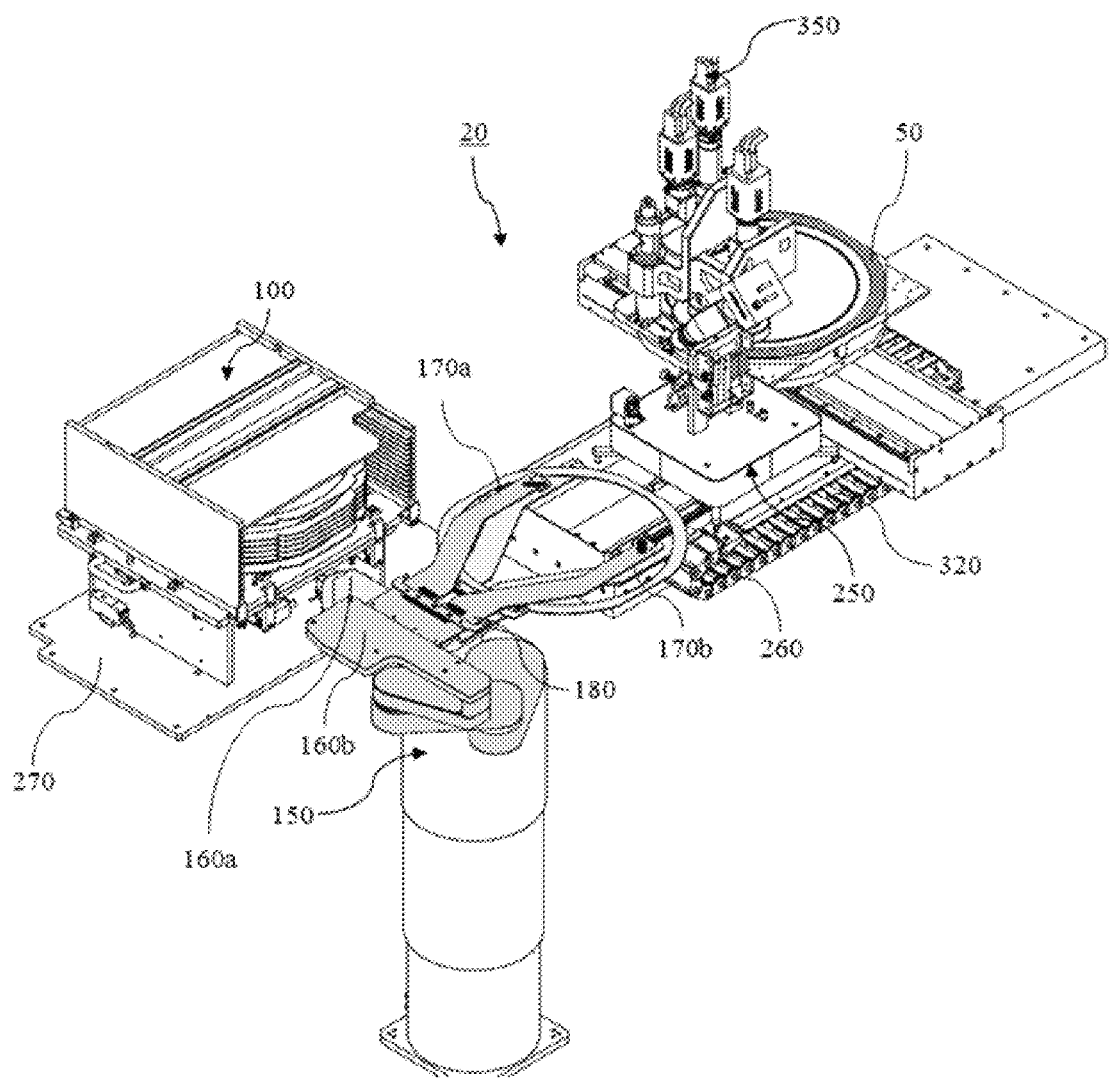
FIG. 2N shows the displacement of the second end effector and corresponding displacement of the second film frame towards the alignment module of the pick and place mechanism such that the second film frame makes contact with the alignment element.
Figure 2O:
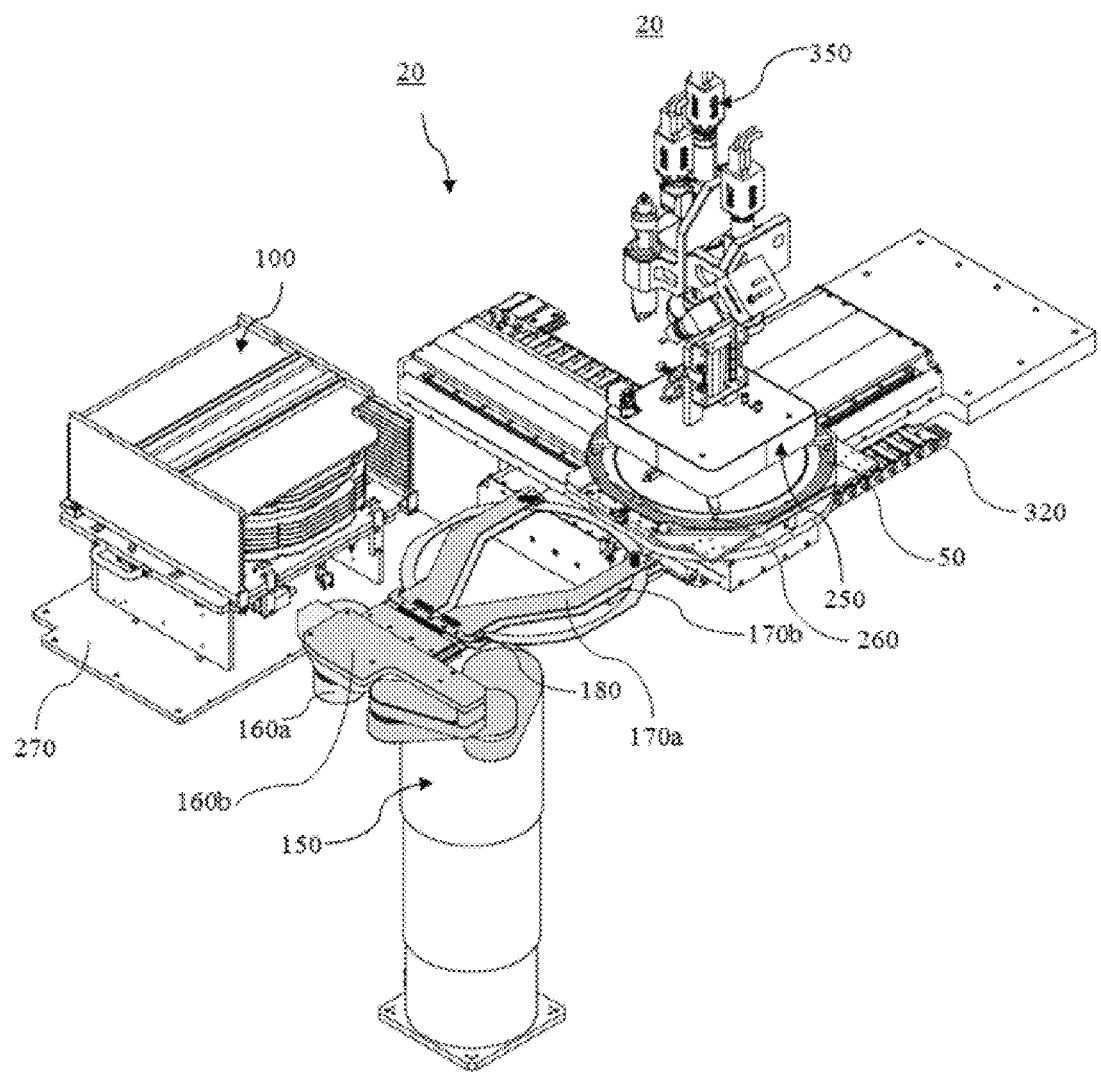
FIG. 2O shows retrieval of the first film frame from the vacuum table by the pick and place mechanism according to an embodiment of the present disclosure.
Figure 2P:
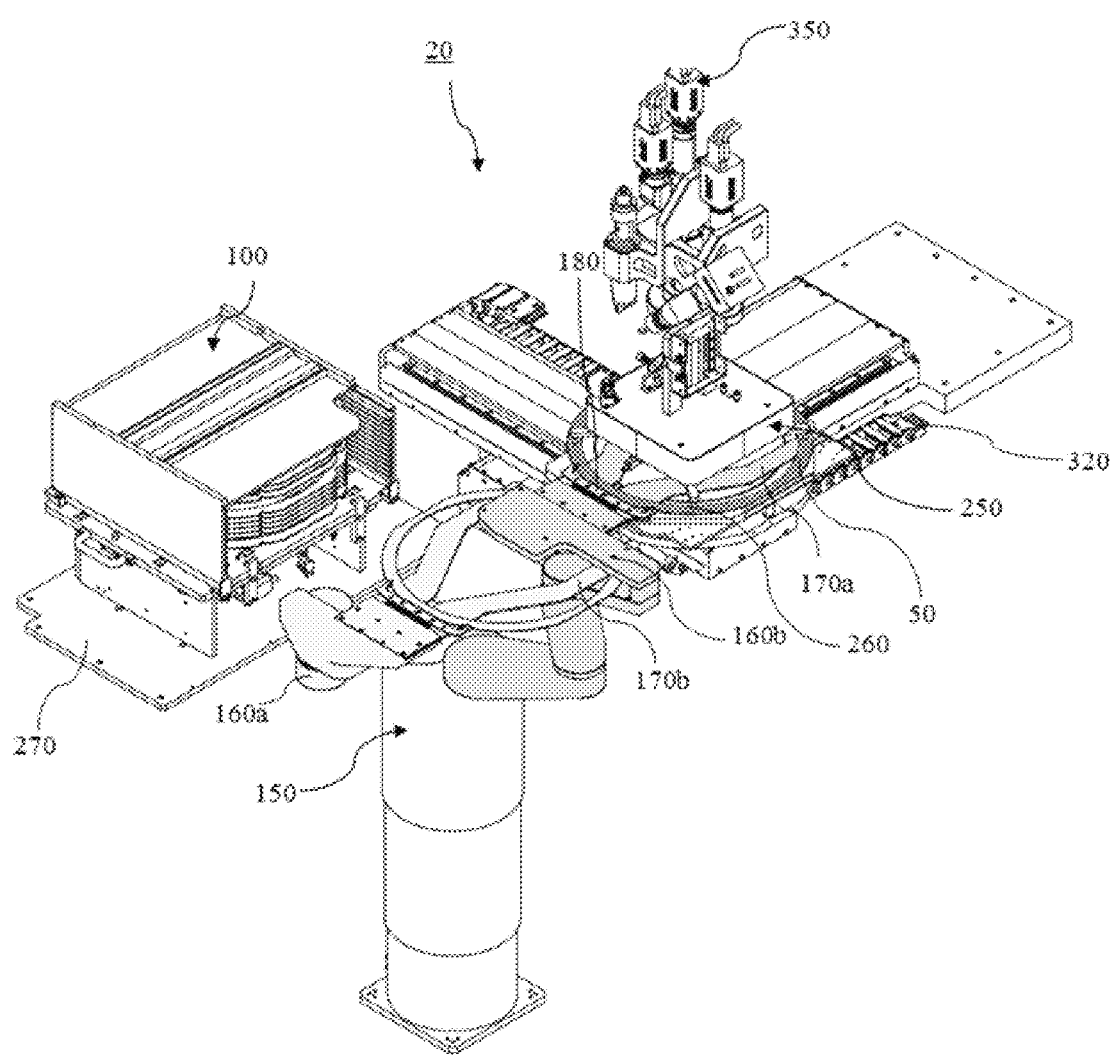
FIG. 2P and FIG. 2Q show the displacement of the first end effector relative to the pick and place mechanism for facilitating transfer of the first film frame from the pick and place mechanism back to the first end effector in accordance with an embodiment of the present disclosure.
Figure 2Q:
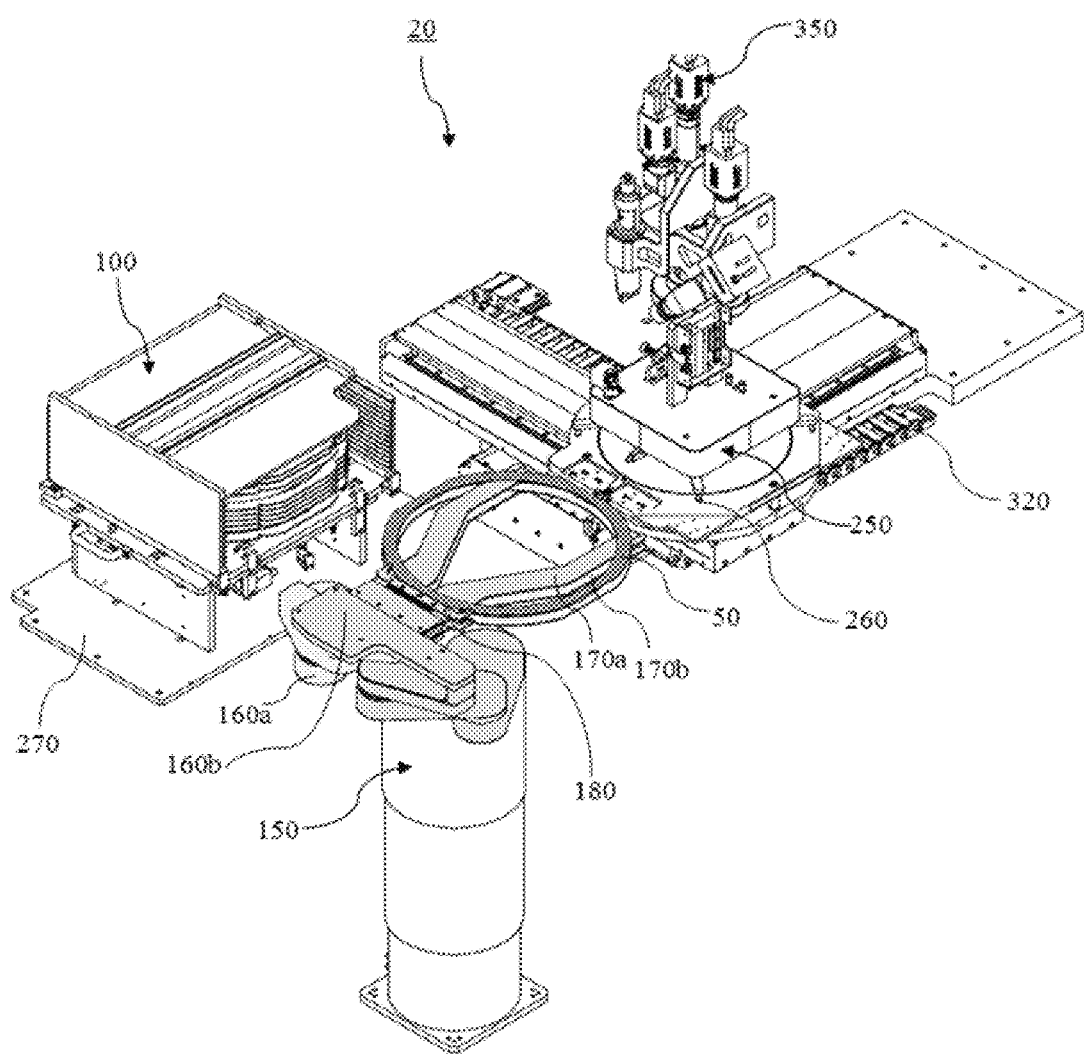
Figure 2R:
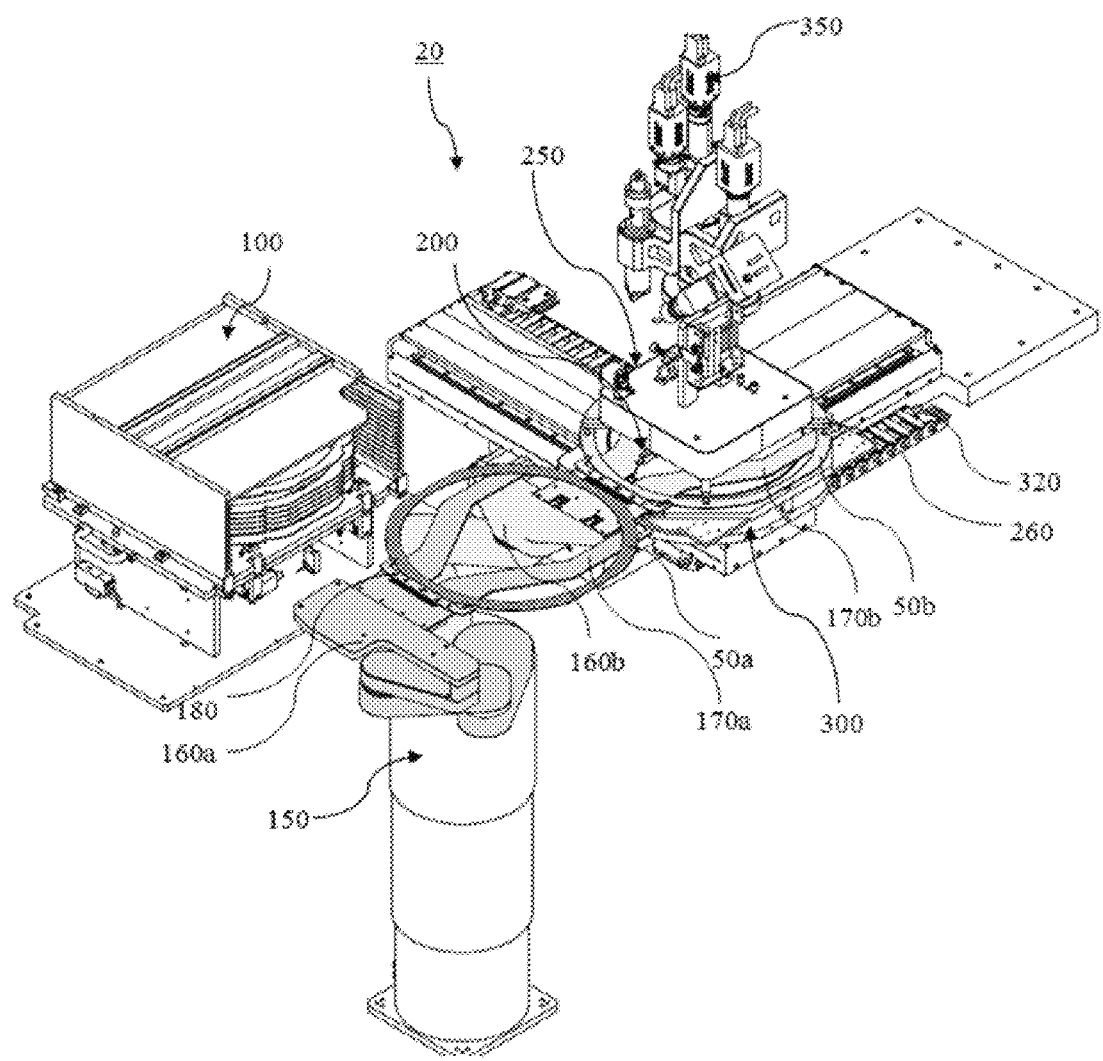
FIG. 2R shows the displacement of the second end effector to position the second film frame carried thereby for pickup by the pick and place mechanism subsequent the removal of the first film frame from the pick and place mechanism in accordance with an embodiment of the present disclosure.
Figure 2S:
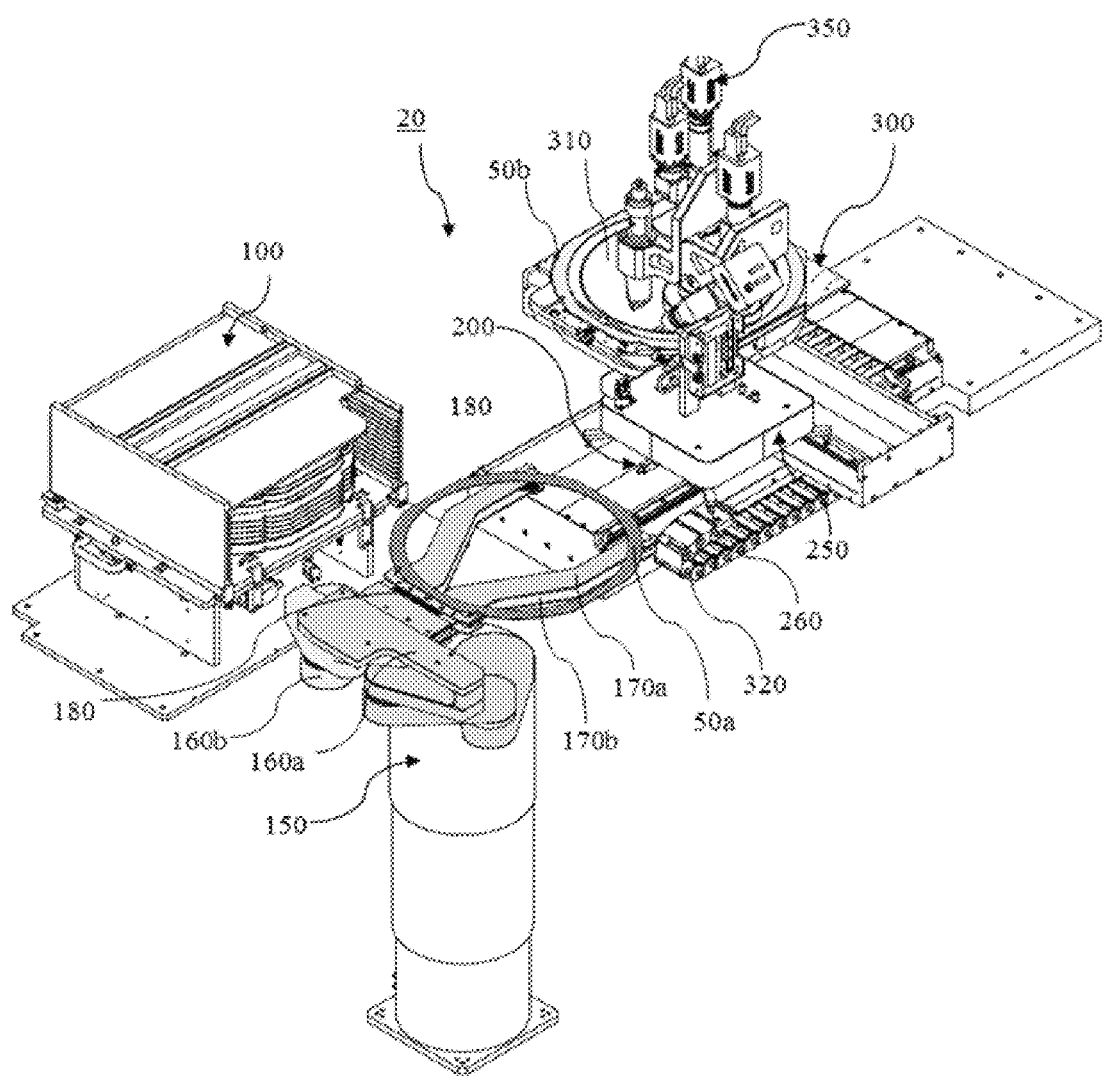
FIG. 2S shows the translation of the vacuum table for displacing the second film frame carried thereby relative to the optical inspection apparatus.
Figure 2T:
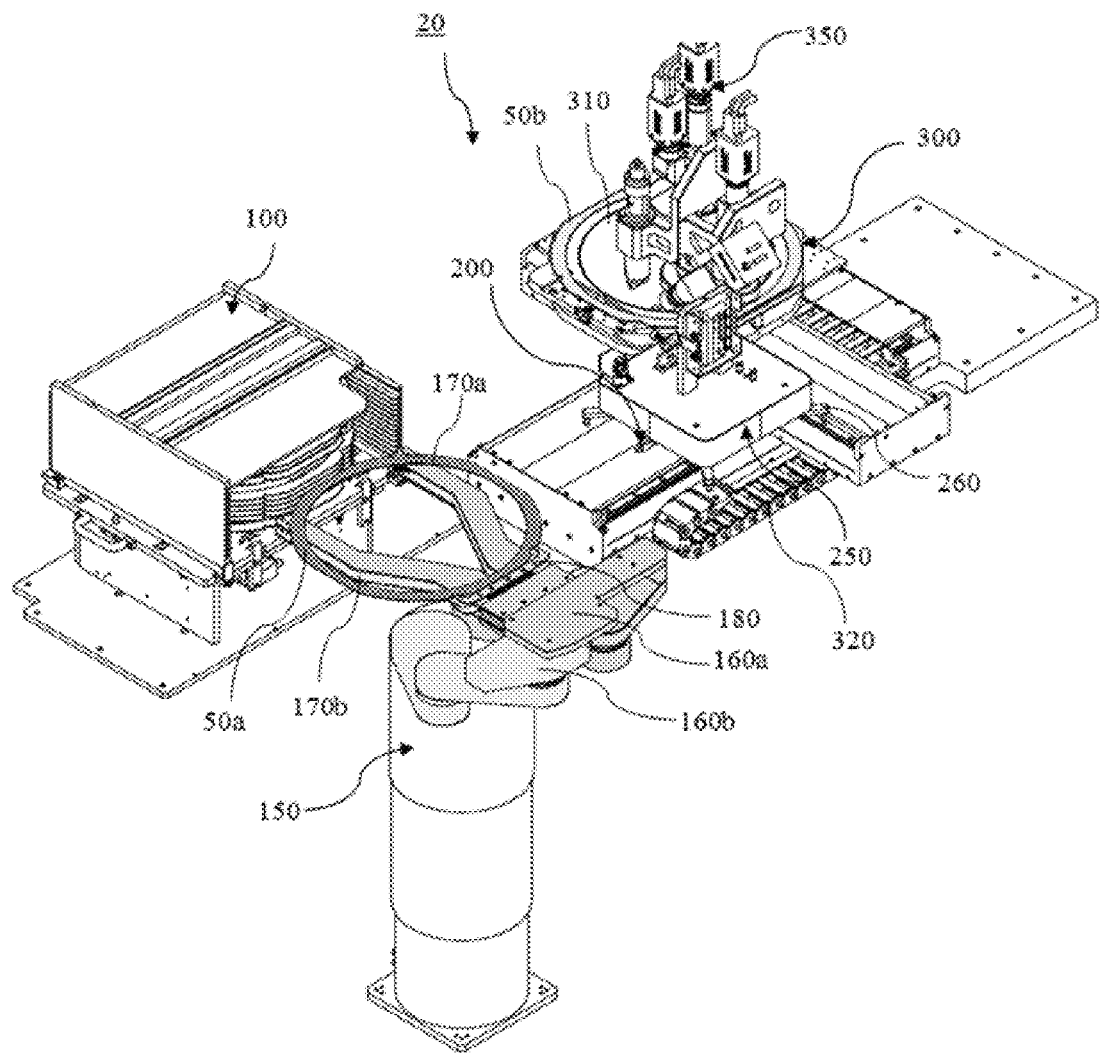
FIG. 2T, FIG. 2U, and FIG. 2V show the rotation and displacement of the first end effector for transferring the first film frame carried thereby to the film frame storage station in accordance with an embodiment of the present disclosure.
Figure 2U:
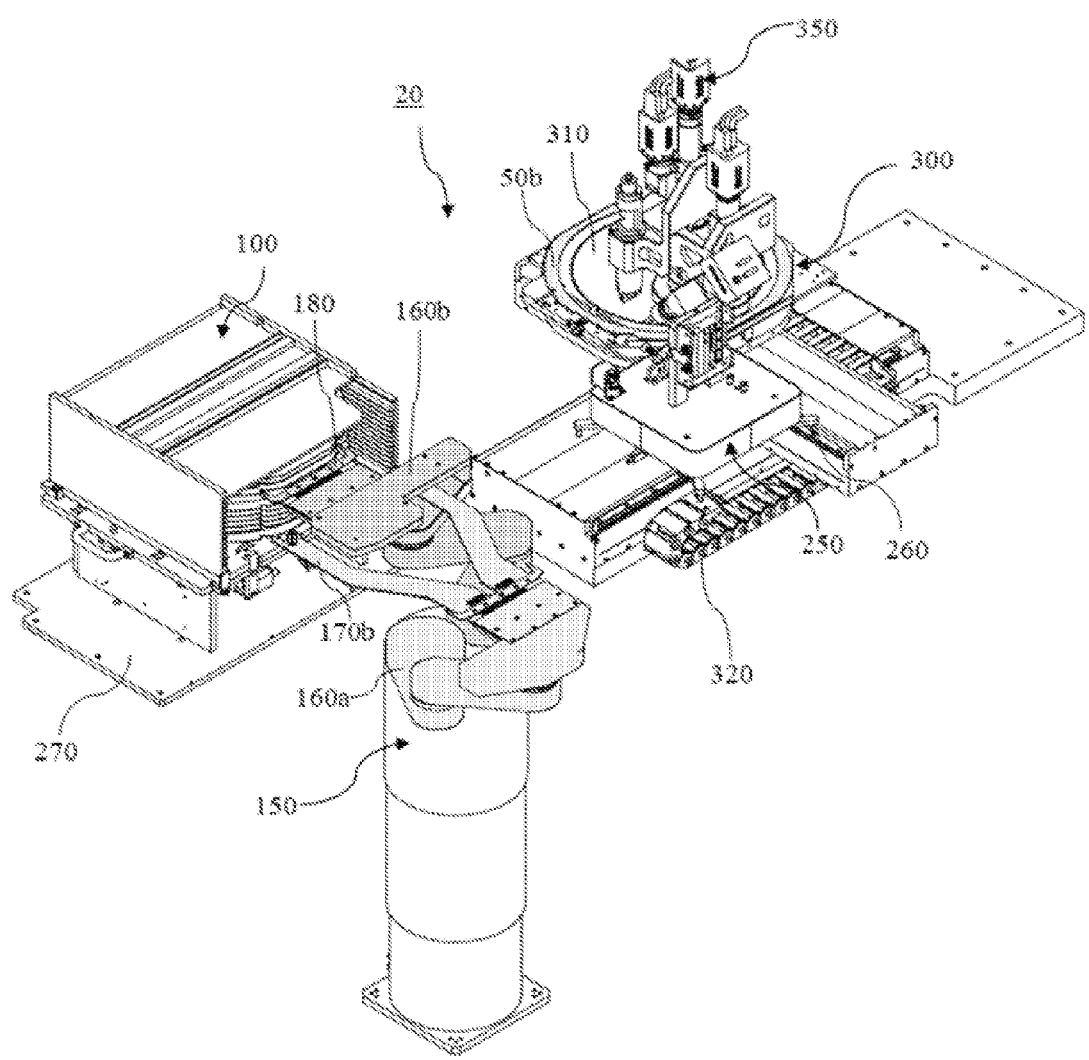
Figure 2V:
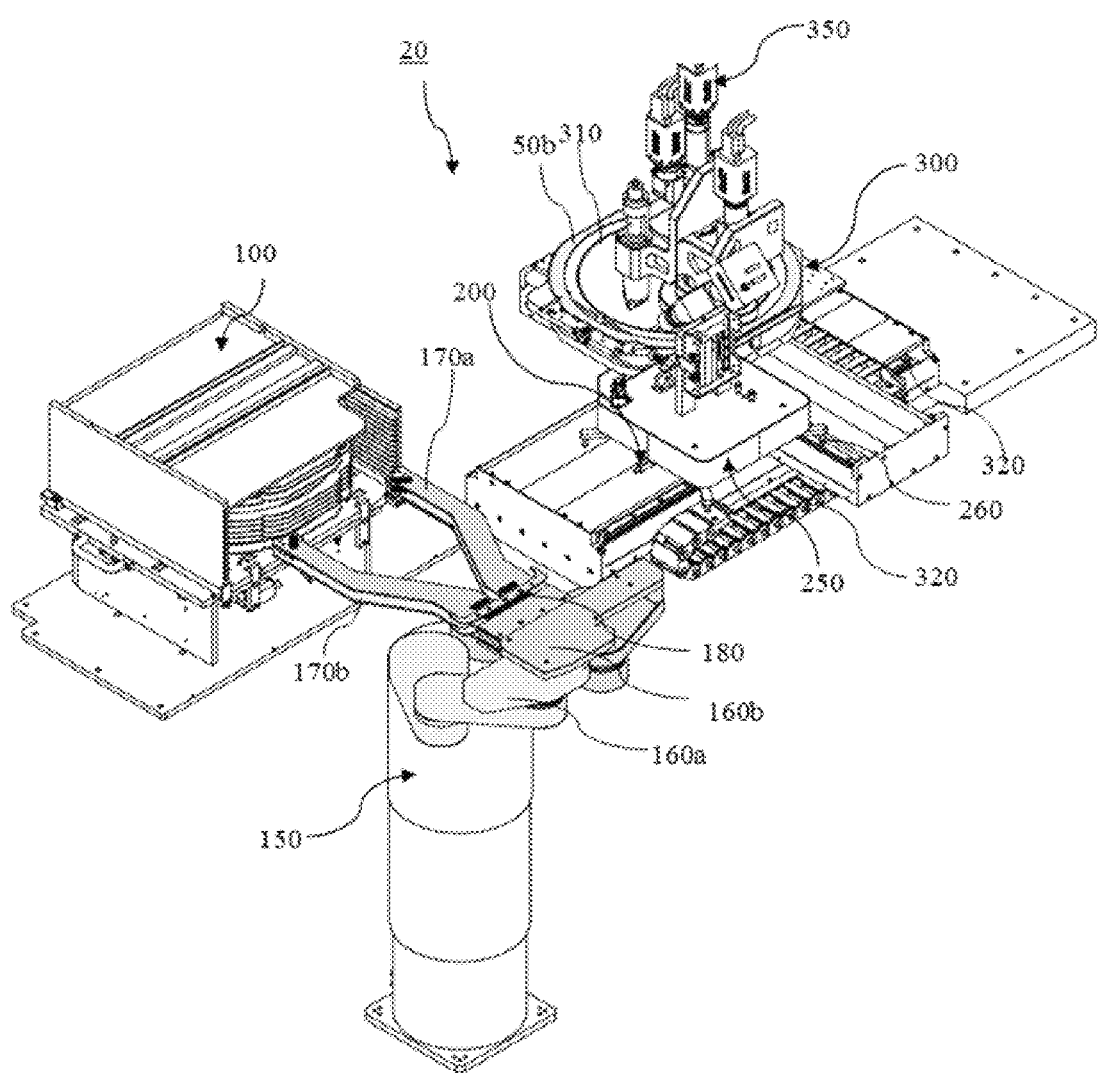
Figure 2W:
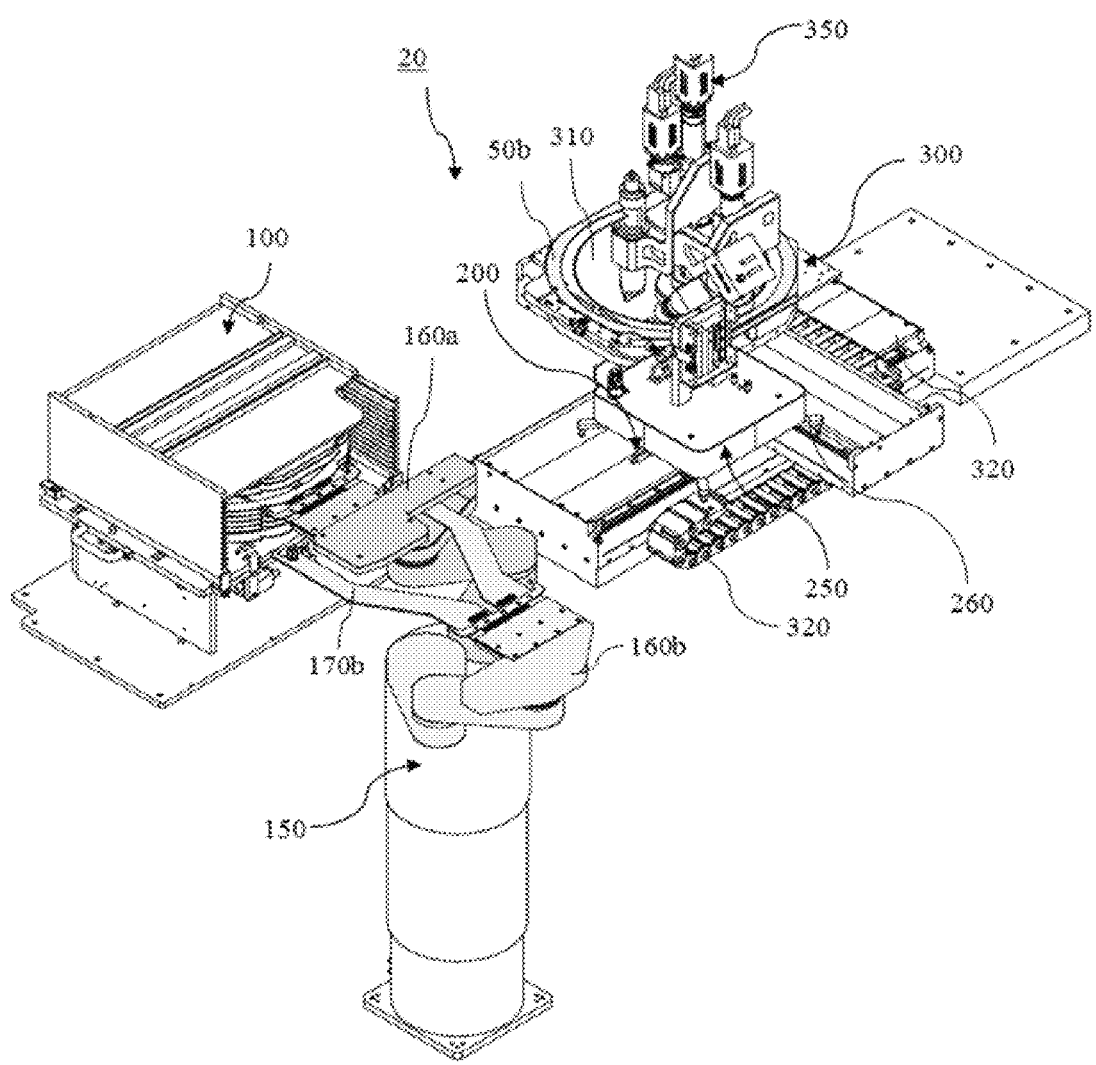
FIG. 2W and FIG. 2X show the displacement of the first end effector for retrieving a third film frame from the film frame storage station in accordance with an embodiment of the present disclosure.
Figure 2X:
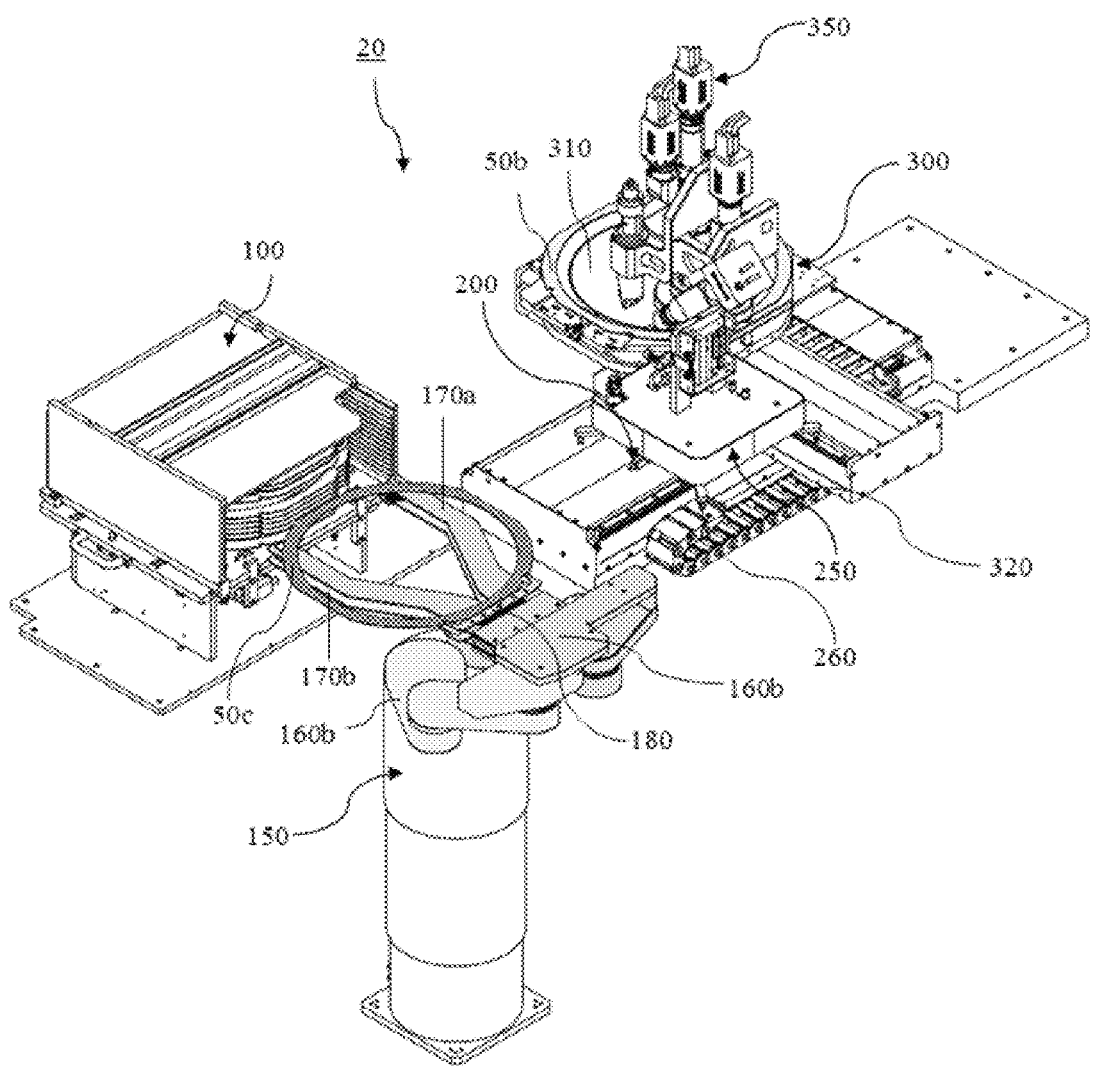
Figure 2Y:
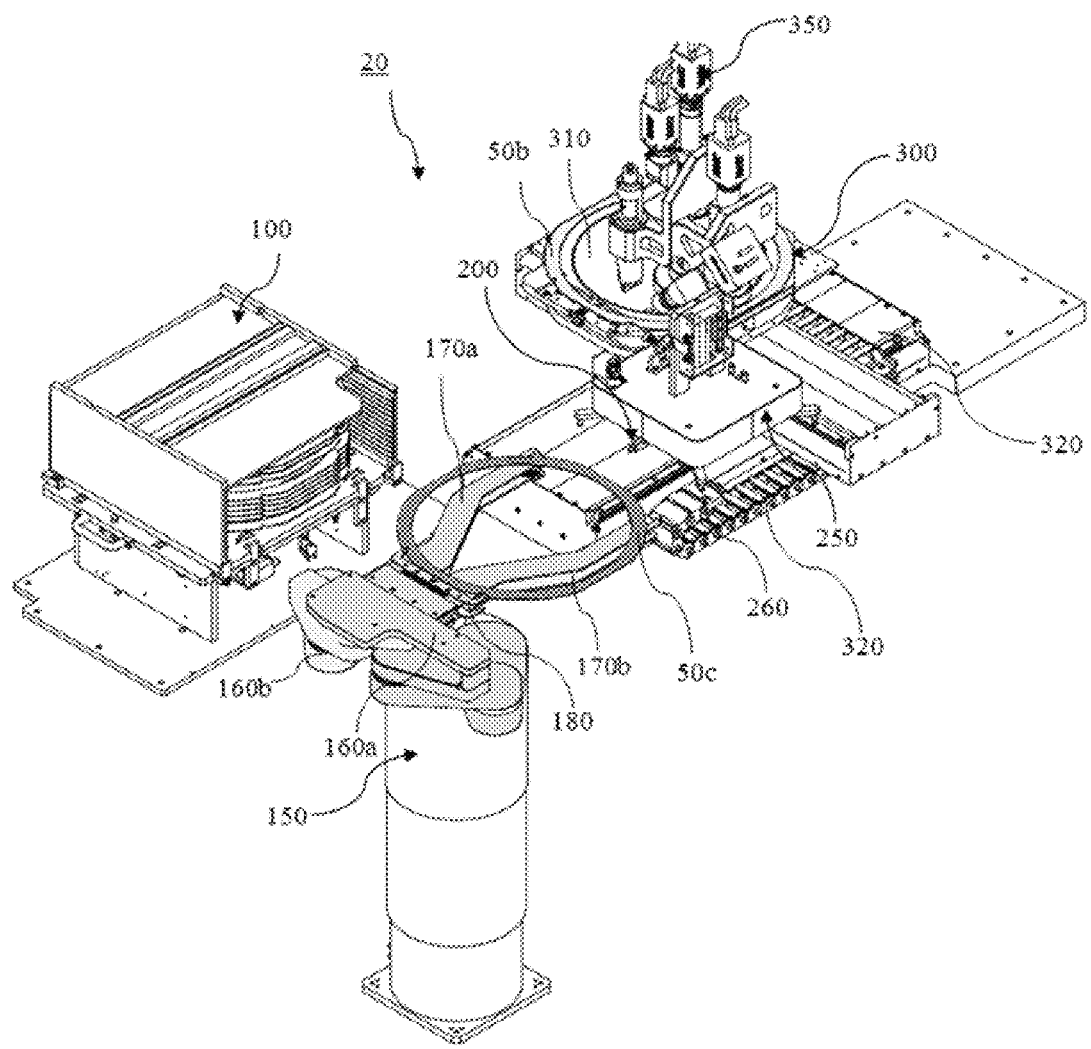
FIG. 2Y shows the rotation of the first end effector for positioning the third film frame at an intended or target position relative to the pick and place mechanism of FIG. 2F.

FIG. 1 and FIG. 2A to FIG. 2Y show the system 20, or particular aspects of the system, at different operational stages, sequences, positions, configurations, or modes in accordance with various embodiments of the present disclosure.

In most embodiments, the system 20 includes a component pane storage station or module 100 (hereinafter referred to as a film frame storage station or module 100); a component pane transfer module 150 (hereinafter referred to as a film frame transfer module 150); a component pane alignment module, device, mechanism, or element 200 (hereinafter referred to as a film frame alignment module 200); a pick and place mechanism, arm, or module 250; a vacuum table assembly 300; and a component inspection apparatus 350.

The system 20 is configured to facilitate or effectuate transfer of component panes 50 or component frames 50, more specifically film frames 50, from the film frame storage station 100 to the vacuum table assembly 300 for inspection of the film frames 50 by the component inspection apparatus 350. In many embodiments, the system 20 is configured for enhancing, improving, or increasing efficiency of transfer of the film frames 50 from the film frame storage station 100 to the vacuum table assembly 300. The system 20 is configured to enable alignment, more specifically spatial or positional alignment, of film frames 50 subsequent retrieval or removal of said film frames 50 from the film frame storage station 100 but prior to transfer of said film frames 50 to the vacuum table assembly 300. In many embodiments, the spatial alignment of a film frame 50 occurs when said film frame 50 is carried by or coupled to a component pane handler 160 (hereinafter referred to as a film frame handler 160) of the component pane transfer module 150.

The spatial alignment of the film frames 50 prior to their transfer to the vacuum table assembly 300 can remove a need for positional alignment or substantial positional alignment of the film frames 50 at the vacuum table assembly 300. Accordingly, the vacuum table assembly 300 need not include any type of positional alignment element(s), pin(s), mechanism(s), module(s), or means for effectuating positional alignment of the film frames 50. This can help to reduce the complexity and/or cost of manufacture and maintenance of the system 20 of the present disclosure as compared to existing semiconductor film frame systems. In addition, the removal of a need for ejector pins required by many conventional systems for aligning film frames at conventional vacuum table assemblies can increase speed and/or efficiency of transfer of film frames 50 to the vacuum table assembly 300.

Additionally, the system 20 includes a control unit (not shown) such as a computer system or device (e.g., a personal computer or a computer workstation) that is configured to cooperatively control the operation of system elements or film frames by way of executing stored program instructions (or computer program software instructions) that define at least one film frame handling, transferring, alignment, and/or inspection sequence in accordance with the present disclosure, as further detailed below.

Aspects of a Representative Component Pane Storage Station (E.g., Film Frame Storage Station)

The component pane storage station 100 or component frame storage station 100, more specifically the film frame storage station 100, is capable of storing, holding, or carrying multiple film frames 50. In many embodiments, the film frame storage station 100 includes a film frame loading/unloading interface or port that is disposed at predetermined location(s) with respect to other elements or component panes of the system 20, and which is configured to carry a film frame storage unit or repository such as a film frame cassette or magazine, in which film frames 50 can reside in a predetermined orientation (e.g., vertically stacked and offset) relative to each other. In several embodiments, the film frame storage station 100 is configured to hold, store, or receive film frames 50 of a same size, for example one of six-inch, eight-inch, or twelve-inch film frames 50. In other embodiments, the film frame storage station 100 is configured to hold, store, or receive film frames 50 of multiple different sizes, for example at least two of six-inch, eight-inch, and twelve-inch film frames 50.

Aspects of a Representative Component Pane Transfer Module (E.g., Film Frame Transfer Module)

The component pane transfer module 150 or component frame transfer module 150, more specifically the film frame transfer module 150, includes or carries a number of component pane handlers 160 or component frame handlers 160, more specifically film frame handlers 160.

In most embodiments, for instance as shown in FIG. 2A to FIG. 2Y, the film frame transfer module 150 includes two film frame handlers 160, namely a first film frame handler 160*a* and a second film frame handler 160*b*. However, systems 20 with alternative numbers of film frame handlers 160, for instance three, four, or more film frame handlers 160, are also included within the scope of the present disclosure.

Aspects of Representative Component Pane Handlers (E.g., Film Frame Handlers)

The component pane handlers 160, for example the film frame handlers 160, can be known as robotic transfer devices or robotic arms. The film frame handlers 160 are configured to transport or transfer film frames 50 between particular locations, components, or portions of the system 20. The relative motions, movement, or operation of the each film frame handler 160, for instance the first film frame handler 160*a* and the second film frame handler 160*b*, can be synchronized relative to each other in order to retrieve, transport, transfer, and/or release film frames 50 in accordance with portions of a programmably defined film frame transfer and/or alignment sequence.

In most embodiments, each component pane handler 160, for example film frame handler 160, includes an end effector 170. The end effector 170 is configured to couple, hold, carry, or secure a component pane 50, for example a film frame 50, thereto during displacement and/or rotation of the end effector 170 for transfer of the component pane 50, more specifically film frame 50, between particular locations, components, or portions of the system 20.

Each end effector 170 can be removably coupled, attached, or screwed, to one of the first component pane handler 160*a* (e.g., first film frame handler 160*a*) and the second component pane handler 160*b* (e.g., second film frame handler 160*b*). The end effector 170 coupled to the first component pane handler 160*a* (e.g., first film frame handler 160*a*) can be referred to as a first end effector 170*a* and the end effector 170 coupled to the second component pane handler 160*b* (e.g., second film frame handler 160*b*) can be referred to as a second end effector 170*b*.

Each end effector 170 can be configured and shaped to couple to, carry, retrieve, or hold component panes 50 (e.g., film frames 50) of a particular size (e.g., 6 inches, 8 inches, or 12 inches). In some embodiments, each of the first and second end effectors 170*a* and 170*b* is configured to couple to or carry component panes 50 (e.g., film frames 50) of a same size. In other embodiments, each of the first and second end effectors 170*a* and 170*b* is configured to couple to or carry component panes 50 (e.g., film frames 50) of a different size.

In several embodiments, each component pane handler 160, more specifically film frame handler 160, together with the end effector 170 thereof, is capable of each of x-axis, y-axis, z-axis, and θ-axis motion. Each film frame handler 160, together with the end effector 170 thereof, can have both translational and rotational motion. Each film frame handler 160, for example the first and second film frame handlers 160*a* and 160*b*, together with the end effectors 170*a* and 170*b* thereof can be coupled to an actuator (or an actuating mechanism, device, or means) (not shown). The actuator is configured for facilitating or effectuating displacement of each film frame handler 160 (e.g., the first and second film frame handlers 160*a* and 160*b*), together with the end effectors 170*a* and 170*b* thereof. For example, the actuator can include, or use, a pneumatic, hydraulic, spring, gear, driven, or electrical mechanism for facilitating or effectuating the displacement of the end effectors 170, for instance from the refracted position to, or towards, the extended position for retrieving film frames 50 from the film frame storage station 100.

In many embodiments, movement of each film frame handler 160 (e.g., each of the first film frame handler 160*a* and the second film frame handler 160*b*) and the end effector 170 thereof (e.g., each of the first end effector 170*a* and the second end effector 170*b*) is controlled by a computer software program executed on a computing device (not shown) coupled to the film frame transfer module 150. Each film frame handler 160 can be automatically moved (e.g., translated and/or rotated) according to a preset or pre-programmed computer software program.

In many embodiments, each of the first film frame handler 160*a* and the second film frame handler 160*b* can be displaced for retrieving a film frame 50 from the film frame storage station 100. More specifically, each of the first end effector 170*a* and the second end effector 170*b* can be extended (e.g., displaced from a retracted position or a first position to an extended position or a second position) for facilitating or effectuating retrieval of a particular film frame 50 from the film frame storage station 100. The displacement of a particular end effector 170, for instance the extension of the end effector 170 from the retracted position to the extended position, can position or dispose the end effector 170 within or internal to the film frame storage station 100 for enabling retrieval of a film frame 50 from said film frame storage station 100.

FIG. 2A to FIG. 2C show the displacement of the first end effector 170*a* of first film frame handler 160*a* between the retracted position and the extended position for retrieving a first film frame 50*a* from the film frame storage station 100. FIG. 2D and FIG. 2E show the displacement of the second end effector 170*b* of the second film frame handler 160*b* between the retracted position to the extended position for retrieving a second film frame 50*b* from the film frame storage station 100.

In most embodiments, each film frame handler 160, includes or carries a registration element or film frame registration element 180 (also referred to as film frame registration module, mechanism, or structure). In multiple embodiments, the registration element 180 of each film frame handler 160 is coupled to or carried by the end effector 170 of said film frame handler 160. The registration element 180 of each film frame handler 160 is shaped, configured, and/or adapted for engagement with the film frame 50, or at least a portion of the film frame 50, carried by said film frame handler 160.

Generally, film frames 50 include at least one registration groove or marker 60 formed, disposed, or located at a peripheral edge or side thereof. The registration groove(s) 60 of each film frame 50 can be shaped and configured to engage or matingly fit with the registration element 180 of the film frame handler 160. In multiple embodiments, the engagement between the registration element 180 of a particular film frame handler 160 (or the end effector 170 of said film frame handler 160) and the registration groove(s) of 60 of a film frame 50 carried by said film frame handler 160 (or end effector 170 of said film frame handler 160) can facilitate or effectuate spatial alignment of the film frame 50.

As mentioned above, the movement or translation of each film frame handler 160 (e.g., each of the first film frame handler 160*a* and the second film frame handler 160*b*) and the end effector 170 thereof (e.g., each of the first end effector 170*a* and the second end effector 170*b*) can be controlled by a computer software program (e.g., computer program instructions) that can be stored and executed on a computing device that is coupled to the film frame transfer module. In some embodiments, the movement or translation of the film frame handler 160 and the end effector 170 thereof can be controlled for facilitating and/or effectuating alignment (e.g., spatial alignment) of the film frame 50 upon or during retrieval of the film frame 50 from the film frame storage station 100.

The movement or translation of the film frame handler 160 and the end effector 170 thereof can be controlled such that engagement between a portion of the film frame 50, for example the registration groove(s) or marker(s) 60 of the film frame 50, and the registration element 180 of the end effector 170 of a particular film frame handler 160 results in alignment (e.g., spatial alignment) of the film frame 50 in a manner that removes a need for further alignment of the film frame 50 relative to the vacuum table assembly 300, for instance when the film frame 50 is positioned at and/or carried by the vacuum table assembly 300. The characteristics of movement (e.g., direction and/or speed of movement) of the film frame handler 160, more specifically the end effector 170 of the film frame handler 160, can be controlled (e.g., determined and/or adjusted) by the computer software program.

In several embodiments, the movement of the film frame handler 160, more specifically the end effector 170 of the film frame handler 160, within the film frame loading station 100 can be controlled such that alignment (e.g., spatial alignment) of the film frame 50 is effectuated at (e.g., within) the film frame loading station 100. For instance, the end effector 170 can be moved (e.g., linearly translated) within the film frame loading station 100 in a manner that causes or effectuates contact between a particular film frame 50 that is retrieved and carried thereby against a surface (e.g., wall) of the film frame loading station 100 to thereby facilitate or effectuate alignment (e.g., spatial alignment) of the film frame 50 in a manner that removes a need for further alignment of the film frame 50 relative to the vacuum table assembly 300, for instance when the film frame 50 is positioned at and/or carried by the vacuum table assembly 300.

In some embodiments, for example in the system 20 as shown in FIG. 1 and FIG. 2A to FIG. 2Y, the registration element 180 includes, or is, a C-channel that is shaped, dimensioned, and/or configured for engaging or coupling to a particular component pane 50 (e.g., film frame 50). For instance, the C-channel, or a portion of the C-channel, is configured to fit (e.g., matingly fit) within the registration groove(s) 60 of the film frame 50.

In some other embodiments, the registration element 180 includes, or is, an elongated C-channel that is shaped, dimensioned, and/or configured for engaging or coupling to a particular component pane 50 (e.g., film frame 50). The elongated C-shaped channel can have a middle portion or main portion that is longer than either one of the terminal portions or protruding portions.

Where the system 20 is configured to handle, transfer, and/or align components or component panes 50 other than film frames 50, for example packaged semiconductor components, electronic components such as PCBs, and solar cells or panels, the registration element 180 can be alternatively configured, designed, and/or adapted for engaging mating, and/or or coupling (e.g., fit coupling) to a portion of said components or component panes 50.

In multiple embodiments, the component pane 50 or component frame 50 does not include any registration groove(s). As such, the registration groove(s) 60 does not always require engagement or coupling (e.g., mating engagement) with the component pane 50 to facilitate or effectuate alignment (e.g., spatial or positional alignment) of the component pane 50.

Aspects of Representative Pick and Place Mechanisms, Arms, or Modules

As shown in each of FIG. 1 and FIG. 2A to FIG. 2Y, the system 20 includes the pick and place mechanism or arm 250. The pick and place mechanism 250 is configured to transfer component panes 50 (e.g., film frames 50) between the component pane handlers 160, for example between the first and second film frame handlers 160*a*, 160*b*. More specifically, the pick and place mechanism 250 is configured to transfer component panes 50 (e.g., film frames 50) between the end effectors 170 (e.g., the first and second end effectors 170*a*, 170*b*) of the component pane handlers 160 (e.g., the first and second film frame handlers 160*a*, 160*b*) and the vacuum table assembly 300.

In most embodiments the pick and place mechanism 250 includes or carries at least one suction element, pad, probe, or module 260 (also referred to as a vacuum element, pad, probe, or module), and in many embodiments a plurality of (e.g., two, three, four, or more), suction elements, pads, probes, or modules 260. The at least one suction element 260 is configured to apply vacuum or suction force. More specifically, the at least one suction element 260 is configured to apply or provide a suction force onto or to the film frame 50, for instance onto or to a surface of the film frame or component, to thereby facilitate or effectuate loading, coupling, or attachment of the film frame 50 to the pick and place mechanism 250.

The at least one suction element 260 is configurable and displaceable to different predetermined positions to pick up component panes 50 (e.g., film frames 50) of different sizes. The application of suction force by the at least one suction element 260 to the film surface of the film frame 50 can also help to secure the film frame 50 to the pick and place mechanism 250 during transfer of the film frame 50 from the film frame handler 160 to the vacuum table assembly 300 by the pick and place mechanism 250.

Although most embodiments of the present disclosure includes and/or utilizes suction elements 260 for applying suction force to load, couple, attach, or secure the component pane 50 (e.g., film frame 50) to the pick and place mechanism 250, it will be understood that alternative or additional methods, techniques, means, or devices can be used for loading, coupling, attaching, or securing a component pane 50 (e.g., film frame 50) to the pick and place mechanism 250 within the scope of the present disclosure. For instance, the pick and place mechanism 250 can alternatively or additionally include gripper(s) and/or adhesive elements (not shown) for facilitating or effectuating the loading, coupling, attachment, or securing a component pane 50 (e.g., film frame 50) to the pick and place mechanism 250.

In various embodiments, the application of suction or vacuum force (e.g., the quantity and/or duration of suction force applied) by the at least one suction element 260 can be controlled and/or varied, for instance depending upon operation or location of the pick and place mechanism 250, speed of displacement of the pick and place mechanism 250, and/or size of film frame 50 handled or transferred by the pick and place mechanism 250. For example, the quantity of suction force applied by the at least one suction element 260 can be adjusted, more specifically increased, with increasing size of component panes 50 (e.g., film frames 50) that is handled or transferred by the pick and place mechanism 250.

The suction force is applied by the at least one suction element 260 of the pick and place mechanism 250 in order to retrieve or pick up the film frame 50 from the film frame handler 160 (e.g., the first film frame handler 160a or the second film frame handler 160b). The suction force is maintained during transfer of the film frame 50 from the film frame handler 160 to the vacuum table assembly 300. The maintenance of the suction force helps to secure the film frame 50 to the pick and place mechanism 250 during displacement of the pick and place mechanism 250 for transferring the film frame 50 from the film frame handler 160 to the vacuum table assembly 300. The application of suction force by the at least one suction element 260 can be terminated, or substantially reduced, when the film frame 50 is proximal to the vacuum table assembly 300, more specifically the vacuum table 310 of the vacuum table assembly 300. The disapplication, termination, or substantial reduction, of the suction force by the at least one suction element 260 can allow or enable release, and subsequent placement, of the film frame 50 onto the vacuum table 310.

The use of suction or vacuum force to pick up, hold, and release film frames 50, enables the vacuum table 310 to exclude, not require, or omit the use of ejector pins. Ejector pins are commonly required with existing or conventional vacuum tables for enabling receipt of film frames and any component(s) carried thereby onto said conventional vacuum tables and subsequent pick up of the film frames and any component(s) carried thereby from said conventional vacuum tables.

In several embodiments of the present disclosure, the at least one suction element 260 includes multiple, for example two, three, four, or more, suction elements 260. The suction elements 260 can be displaced, positioned, and/or disposed at different positions relative to each other. In particular, the suction elements 260 can be variably positioned to facilitate or effectuate pick up, retrieval, and/or coupling of film frames 50 of different sizes (e.g., 6-inches, 8-inches, and 12-inches) by or to the pick and place mechanism 250. It will be understood that the film frames 50 of other sizes can also be picked up or retrieved by the pick and place mechanism 250.

In some embodiments, the pick and place mechanism 250 includes a number of movable arms (not shown). In certain embodiments, each movable arm can carry or be coupled to at least one suction element 260. Each movable arm, or at least a portion of each movable arm, can be displaced (e.g., rotated and/or translated) to thereby displace the at least one suction element 260 carried thereby between different positions. Therefore, the displacement (e.g., rotation and/or translation) of the multiple movable arms can facilitate or effectuate varying the relative position of the suction elements 260 to thereby enable pick up, retrieval, or coupling of component panes 50 (e.g., film frames 50) of different sizes by or to the pick and place mechanism 250.

In specific embodiments, the suction element(s) 260 coupled to or carried by each movable arm can be displaced relative to (e.g., along a length of) the movable arm of the pick and place mechanism 250. The displacement of the suction element(s) 260 along the moveable arm(s) can change the relative position of the suction elements 260 and thereby enable the suction elements 260 of the pick and place mechanism 250 to pick up, retrieve, hold, and/or couple to component panes 50 (e.g., film frames 50) of different sizes.

The ability of the pick and place mechanism or module 250 to pick up, retrieve, handle, hold, or couple to component panes 50 (e.g., film frames 50) of different sizes allows the system 20 to handle and/or transfer component panes 50 (e.g., film frames 50) of different sizes without a need to change, substitute, or modify particular parts or elements, for instance the pick and place mechanism 250, of the system 20. Therefore, the ability of the pick and place mechanism 250 to pick up, retrieve, handle, hold, or couple to component panes 50 (e.g., film frames 50) of different sizes results in a more robust and cost-efficient system 20 that can be easier, simpler, and/or cheaper to manufacture and/or assemble.

Aspects of Component Pane Alignment Element, Module, or Mechanism (E.g., Film Frame Alignment Element, Module, or Mechanism)

As described above, in many embodiments, the component pane 50 (e.g., film frame 50) is spatially aligned prior to transfer thereof from the component pane handler 160, for example the first film frame handler 160a or the second film frame handler 160b to the pick and place mechanism 250.

In multiple embodiments, the film frame 50 is spatially aligned prior to transfer of the film frame 50 to the vacuum table assembly 300, more specifically onto the vacuum table 310 of the vacuum table assembly 300, in a manner that satisfies the alignment conditions of the film frame 50 relative to the vacuum table 310 for subsequent inspection or processing operations on the vacuum table 310.

The use of suction force for retrieving or picking up the film frame 50 from the film frame handler 160, more specifically from a surface of the end effector 170 of the film frame handler 160; and for coupling or holding the film frame 50 to the pick and place mechanism 250 during transfer of the film frame 50 from the film frame handler 160 to the vacuum table assembly 300 can help to preserve the established, completed, or substantially completed spatial alignment or orientation of the film frame 50 that is achieved prior to transfer of the film frame 50 to the pick and place mechanism 250.

The system 20 includes the component pane alignment element, module, or mechanism 200 (e.g., film frame alignment element, module, or mechanism 200). As shown in FIG. 2G and FIG. 2H, in many embodiments of the present disclosure, the alignment module 200 is carried by the pick and place mechanism 250. The alignment module 200 can be coupled to or carried by the pick and place mechanism 250 at or proximate to a peripheral edge or side (i.e., along a perimeter) of the pick and place mechanism 250.

In several embodiments, the alignment module 200 projects or extends a particular or predetermined distance from a peripheral edge or side of the pick and place mechanism 250. The projection or extension of the alignment module 200 at a distance away from the peripheral edge or side of the pick and place mechanism 250 can help to facilitate access of the alignment module 200 to the film frame 50. In other words, the alignment module 200 can be positioned, disposed, or located in order to enable easy, convenient, and/or unrestricted access of the alignment module 200 to the film frame 50.

Although in many embodiments the alignment module 200 is positioned at or proximate to a peripheral edge or side of the pick and place mechanism, it will be appreciated that alternative positions of the alignment module 200 external to the film frame storage station 100 is also possible. For instance, the alignment module 200 can be a standalone system element, component, or structure; or can be coupled to or carried by another system element, component, or structure. In many embodiments, the alignment module 200 can be located at the periphery of the pick and place mechanism.

In particular embodiments, the alignment module 200 may include at least two alignment elements. Each alignment element of the at least two alignment elements can be disposed or positioned at a distance apart from each other. In addition, each alignment element can be positioned substantially at a diagonal opposite to the registration groove(s) 60 of a particular film frame 50 carried by an end effector 170 of a component frame handler 160.

In several embodiments, the end effector 170 is displaceable relative to the alignment element or module 200. Displacement of the end effector 170 relative to the alignment module 200 results in corresponding displacement of the component pane 50 (e.g., film frame 50) carried by the end effector 170 relative to the alignment module 200.

The displacement of the end effector carrying the film frame 50 relative to, more specifically to or towards, the alignment module 200 can facilitate or effectuate spatial alignment of the film frame 50 in a manner that removes a need for further spatial alignment or substantially spatial alignment of the film frame 50. More specifically, the displacement of the end effector 170 can displace the film frame 50 carried thereby to or towards the alignment module 200 such that the alignment module 200 makes contact with said film frame 50 and/or applies a force against or to the film frame 50, more specifically to a side, edge, extremity, or periphery of the film frame 50.

In particular embodiments wherein the alignment module 200 includes two or more alignment elements, the displacement of the end effector 170, and hence the film frame 50 carried thereby, to or towards the alignment module 200 can result in contact between the at least two alignment elements and at least two contact positions along the side, edge, extremity, or periphery of the film frame.

Force applied against or to the film frame 50, more specifically to a side, edge, extremity, or periphery of the film frame 50, for instance by the alignment module 200, can effectuate or enhance engagement of the film frame 50, more specifically the registration groove(s) 60 of the film frame 50, to the registration element 180 of the end effector 170. More specifically, force applied against or to the film frame 50, more specifically to a side, edge, extremity, or periphery of the film frame 50, for instance by the alignment module 200, can push the film frame 50 in a direction to or towards the registration element 180 carried by the end effector 170 to thereby effectuate or enhance engagement between the registration groove(s) 60 of the film frame 50 and the registration element 180 of the end effector. In multiple embodiments, the engagement between the registration groove(s) 60 of the film frame 50 and the registration element 180 of the end effector 170, or the enhanced engagement between the registration groove(s) 60 of the film frame 50 and the registration element 180 of the end effector 170, facilitates or effectuates spatial alignment of the film frame 50 in a manner that removes a need for further spatial alignment or substantially spatial alignment of the film frame 50.

In various embodiments, the alignment element or module or position alignment element 200 includes or carries at least one spring-loaded mechanism or element (not shown). The spring-loaded mechanism or element can be referred to as a tensioned mechanism or element. The alignment module 200 that includes said spring-loaded mechanism can be referred to as spring-loaded position alignment element, module, or mechanism 200. The spring-loaded mechanism can be configured for enhancing spatial alignment of the film frame 50 effectuated by the alignment module 200. In various embodiments, the alignment module 200 includes two or more spring-loaded mechanisms or elements.

In several embodiments, the spring-loaded mechanism of the alignment module 200 is configured to prevent, reduce, or limit deformation or damage to the film frames 50 during position alignment of the film frames 50 by the alignment module 200. In particular embodiments, the spring-loaded mechanism can be configured to absorb at least a part of the force applied to the film frame 50 upon contact between the film frame 50 and the alignment module 200. More specifically, the spring-loaded mechanism can be configured to absorb excess or un-necessary force applied to the film frame 50 upon contact between the film frame 50 and the alignment module 200 to thereby reduce, prevent, or eliminate deformation or damage to the film frame 50, for instance due to impact between the film frame 50 and the alignment module 200.

Although the spring-loaded mechanism is described above for preventing, reducing, or limiting deformation or damage to the film frames 50 during contact, and hence impact, between the film frames 50 and the alignment module 200, it will be understood that the spring-loaded mechanism can be substituted or supplemented by other mechanisms or modules, for instance a hydraulic piston mechanism or module. The hydraulic piston mechanism is configured to prevent, reduce, or limit deformation or damage to the film frames 50 during position alignment of the film frames 50 by the alignment module 200. The hydraulic piston mechanism can include a tube holding or storing a volume of compressible fluid (e.g., liquid and/or gas), the tube having multiple perforations encapsulated with a cover. Upon contact between the film frame 50 and the hydraulic piston mechanism, a portion of the compressible fluid will flow out from the tube via the perforations and thus absorb, and hence, reduce, the force or impact applied to the film frame 50.

In particular embodiments, the position alignment element or module or alignment module 200 can include, carry, or be coupled to a sensor unit (not shown) configured to at least one of sense contact made between a film frame 50 and the alignment module 200, quantity of force applied to a film frame 50 in association with the contact made between the film frame 50 and the film frame position alignment element or alignment module 200, and accuracy of position and/or duration of contact made between the film frame 50 and the alignment module 200. Accordingly, use of the sensor unit can aid effectuating, monitoring, and/or enhancing the position alignment of the film frame 50 by the alignment module 200.

In specific embodiments of the present disclosure, the system 20 does not require use of the film frame alignment module 200 for facilitating or effectuating alignment (e.g., spatial alignment) of film frames 50. In such embodiments, the movement or translation of the end effector 170 of a particular film frame handler 160 when retrieving film frames 50 from the film frame loading station 100 can be controlled in a manner that facilitates or effectuates alignment of the film frame 50. The movement of the end effector 170 can be controlled (e.g., by the computer software program) for facilitating or effectuating alignment of the film frame 50 upon, during, or after engagement between the registration groove(s) or marker(s) 60 of the film frame 50 and the registration element 180 of the end effector 170. Accordingly, in particular embodiments, the system 10 is able to omit the use of the film frame alignment module 200.

Aspects of the Vacuum Table Assembly 300

As described above, the spatial alignment of the component pane 50 (e.g., film frame 50) prior to transfer of the component pane 50 (e.g., film frame 50) to the vacuum table assembly 300, more specifically onto the vacuum table 310 of the vacuum table assembly 300 enables removal of a need for the vacuum table assembly 300 to include and/or use any position alignment element(s), pin(s), structure(s) or mechanism(s). The spatial alignment of the component pane 50 (e.g., film frame 50) prior to placement of the component pane 50 (e.g., film frame 50) onto the vacuum table 310 eliminates a need for further alignment of the component pane 50 (e.g., film frame 50) relative to the vacuum table 310 after placement of the component pane 50 (e.g., film frame 50) on the vacuum table 310. Therefore, the vacuum table assembly 300 or the vacuum table 310 of multiple embodiments of the present disclosure does not require, include, or carry position alignment element(s), pin(s), structure(s), or mechanism(s) that are conventionally required by existing systems.

The vacuum table assembly 300 includes the vacuum table 310 and a translation apparatus 320 that is coupled to the vacuum table 310. The translation apparatus 320 can be configured or adapted to enable X-axis, Y-axis, Z-axis, and/or θ-axis motion, movement, or displacement of the vacuum table 310. The translation apparatus 320 can be configured to control, determine, and/or effectuate translation, displacement, and position of the vacuum table with respect to particular portions of the inspection or processing station 350.

The vacuum table 310 includes a planar or generally planar surface that is configured to carry film frames 50, and which is further configured to apply vacuum forces to the film frames 50 and their associated polymer film such that the film frames 50 (e.g., the film frames and component(s) carried thereby) are held, retained, or maintained in a fixed position or orientation with respect to the vacuum table 310 during vacuum table translation and/or film frame inspection or processing operations.

In multiple embodiments, the vacuum table assembly 300 omits or excludes registration elements (e.g., component pane registration elements such as film frame registration elements or alignment elements, and other like spatial alignment, orientation, or positioning elements or tools). In addition, in several embodiments, the vacuum table 310 omits or excludes ejector pins. The vacuum table 310 can additionally omit or exclude machined surface recesses, rings, or grooves (e.g., vacuum distribution rings). The removal of the need for further spatial alignment or orientation of the film frame 50 relative to vacuum table 310 when the film frame 50 is transferred to the vacuum table assembly 300, and accordingly the removal of any need for the vacuum table assembly 300 to carry registration elements (e.g., component pane registration elements such as film frame registration elements or alignment elements, and other like spatial alignment, orientation, or positioning elements or tools) can increase the efficiency, robustness, simplicity of design, and/or cost-effectiveness of systems 20 of the present disclosure.

As described above, the system 20 also includes the component inspection apparatus 350. The component inspection apparatus 350 can be an optical inspection apparatus or an image capture device configured to capture images of the component pane 50, more specifically film frame 50, or particular portion(s) thereof. The vacuum table 310, and accordingly the component pane 50 (e.g., film frame 50) carried by the vacuum able 310, can be displaced across a plurality of predetermined inspection positions (e.g., image capture positions), at which image(s) of the component pane 50 (e.g., film frame 50), or portion(s) thereof, can be captured by the component inspection apparatus 350 or optical inspection apparatus. The spatial alignment, orientation, or position of the component pane 50 (e.g., film frame 50) during inspection, for instance image capture of the component pane 50 (e.g., film frame 50), is important for accurately determining defect position(s) on the component pane 50 (e.g., film frame 50).

Subsequent the inspection of the film frame 50 by the component inspection apparatus 350, the vacuum table 310 can be translated and positioned to allow the pick and place mechanism 250 to retrieve, remove, or pick up the film frame 50 from the vacuum table 310. Suction or vacuum force is applied by the at least one suction element 260 of the pick and place mechanism 250 in order to retrieve, remove, or pick up the film frame 50 from the vacuum table 310. The pick and place mechanism 250 then transfers the film frame 50 from the vacuum table 310 to the end effector 170 of the film frame handler 160.

In several embodiments of the present disclosure, the vacuum table 310 is capable of receiving and carrying components, more specifically film frames 50, of multiple different sizes, for example, six, eight, and/or twelve inches. The system 20 according to many embodiments of the present disclosure facilitates or allows the processing or inspection of film frames 50 of multiple different sizes without a need to change or modify the vacuum table 310. The ability of the vacuum table 310 of multiple embodiments to carry film frames 50 of various sizes increases at least one of robustness, cost-effectiveness, and/or mechanical simplicity of the system 20 while eliminating inefficiency associated with vacuum table or vacuum table assembly "swap out" or modification when converting a system for handling components (e.g., film frames 50) of different sizes.

Aspects of the Representative Process or Method Embodiments

Figure 3A:
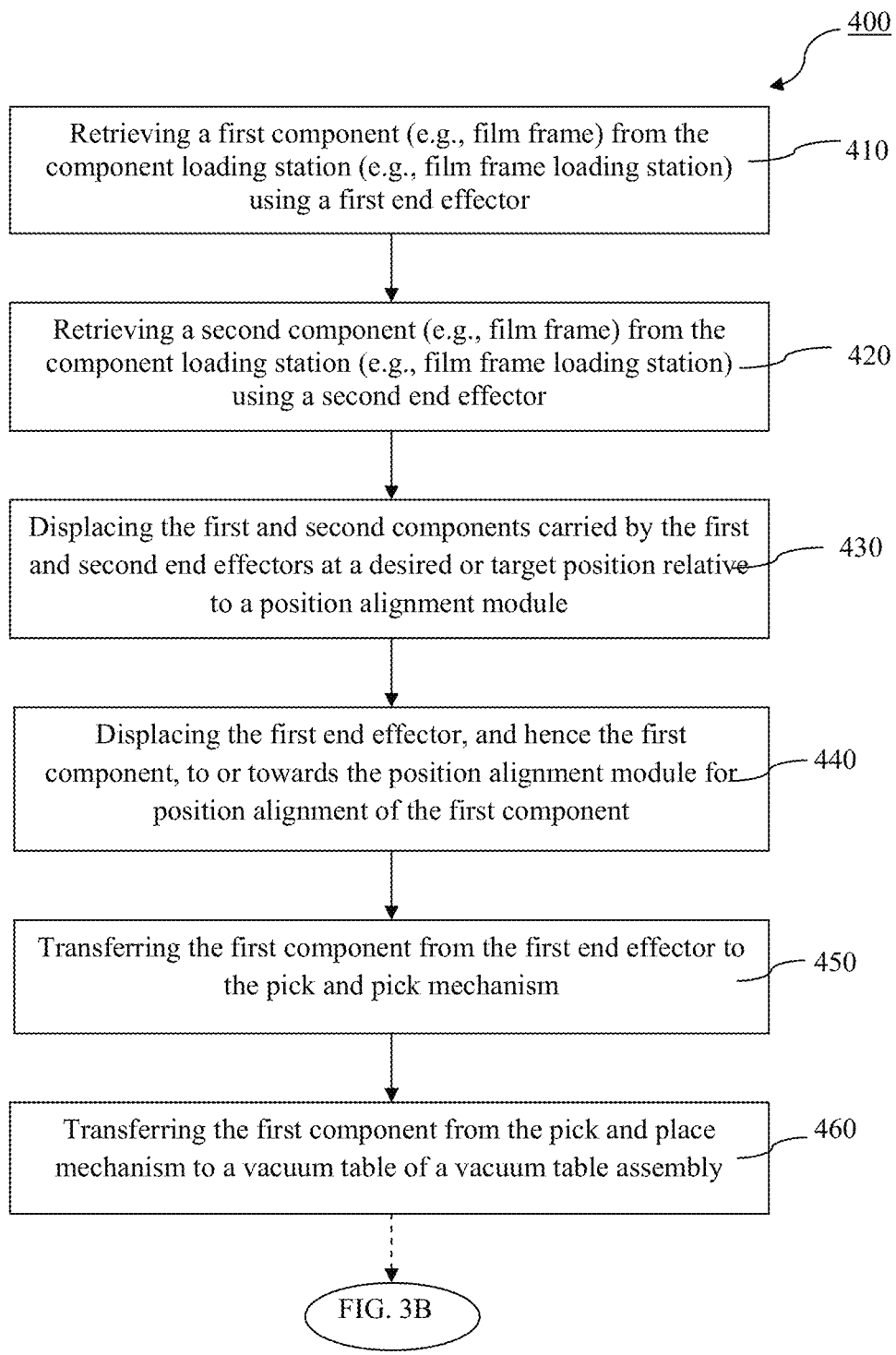
FIG. 3A and FIG. 3B provide a flowchart of a method or process for handling, transferring, and aligning component panes, for example film frames and any component(s) carried thereby, according to an embodiment of the present disclosure.
Figure 3B:
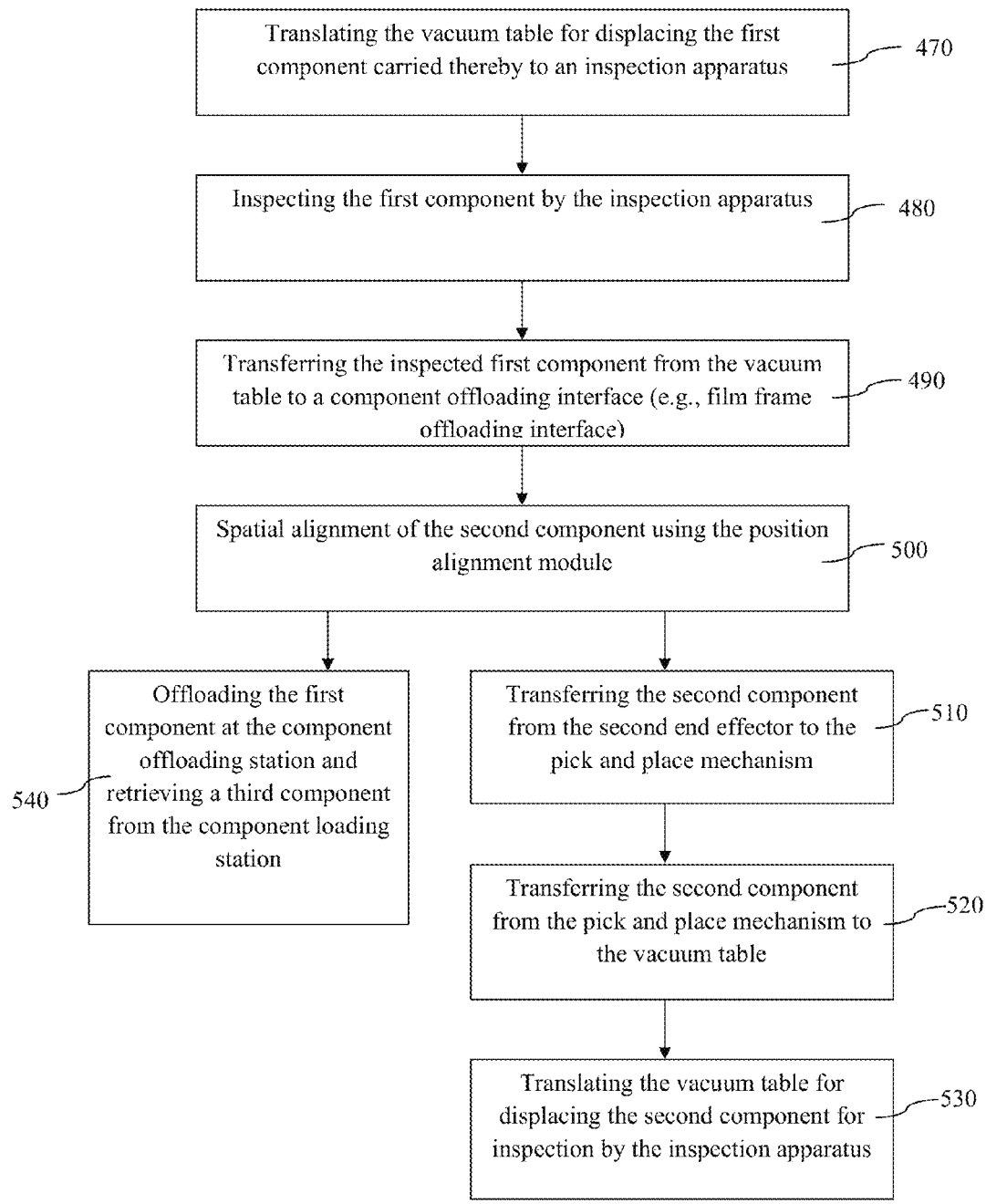

FIG. 3A and FIG. 3B show a process 400 for handling, transferring, and aligning component panes 50 or component frames 50, more specifically as film frames 50, in accordance with particular embodiments of the present disclosure. The process 400 can be partially or fully performed, facilitated, effectuated, and/or completed using the system 20, or at least a portion of the system 20.

In a first process portion 410, the first component pane handler 160a, more specifically the first film frame handler 160a, is displaced for retrieving a first component pane 50a, more specifically a first film frame 50a, from the component pane storage station 100, more specifically the film frame storage station 100.

The end effector 170a of the first component pane handler 160a, more specifically the first film frame handler 160a, is displaced, for instance from a retracted, rest, or first position to an extended or second position, for retrieving the first component pane 50a, more specifically the first film frame 50a, from the component pane storage station 100.

The first component pane handler 160a, more specifically the first end effector 170a of the first component pane handler 160a, can be aligned with the component pane storage station 100 (also referred to as the film frame storage station 100), more particularly with the first component pane 50a stored or carried by the component pane storage station 100 (e.g., by a component pane storage unit or cassette carried by the component pane storage station 100), prior to displacement of the first end effector 170a for retrieving the first component pane 50a from the component pane storage station 100.

FIG. 2A shows the alignment of the first end effector 170a with the component pane storage station 100, more particularly with the first component pane 50a stored or carried by the component pane storage station 100, prior to displacement of the first end effector 170a for retrieving the first component pane 50a from the component pane storage station 100. FIG. 2B shows displacement and position of the first end effector 170a at the extended position for retrieving the first component pane 50a from the component pane storage station 100. FIG. 2C shows the first component pane 50a carried by the first end effector 170a upon retrieval of the first component pane 50a from the component pane storage station 100.

In a second process portion 420, the second component pane handler 160b, more specifically the end effector 170b of the second component pane handler 160b, is displaced for retrieving a second component pane 50b from the component frame storage station 100. More specifically, the second end effector 170b is displaced, for instance from a refracted, rest, or first position to an extended or second position, for retrieving the second component pane 50b from the component pane storage station 100.

The second end effector 170b can be aligned with the component pane storage station 100, more particularly with the second component pane 50b stored or carried by the component pane storage station 100 (e.g., by a film frame storage unit of the film frame loading station 100), prior to displacement of the second end effector 170b for retrieving the second component pane 50b from the component pane storage station 100.

The first and second component panes 50a, 50b are located or disposed at different vertical heights (e.g., stacked one on top of the other) in the component pane storage unit of the component pane storage station 100, and hence the first end effector 170a and the second end effector 170b have to be positioned at different heights or elevations to accurately retrieve the first and second component panes 50a, 50b respectively from the component pane storage unit.

FIG. 2D shows the displacement and position of the second end effector 170b at the extended position for retrieving the second component pane 50b from the component pane storage station 100. FIG. 2E shows the second component pane 50b carried by the second end effector 170b upon retrieval of the second component pane 50b from the component pane storage station 100. As can be seen from FIG. 2E, the first and second component pane handlers 160a and 160b, more specifically the first end effector 170a carrying the component pane 50a and the second end effector 170b carrying the second component pane 50b, are positioned at different elevations or heights relative to each other (i.e., the first end effector 170a carrying the component pane 50a is seen in FIG. 2E to be disposed above the second end effector 170b carrying the second component pane 50b).

The displacement of the end effectors 170 (e.g., the first and second end effectors 170a, 170b) of the first and second component pane handlers 160a, 160b can be synchronized, or substantially synchronized, to increase the efficiency of retrieval of component panes 50 (e.g., first and second component panes 50a, 50b or first and second film panes 50a, 50b) from the component pane storage station 100, more specifically the film frame storage stations 100. For instance, the displacement of the first and second end effectors 170a, 170b can be effectuated in a controlled, sequential, and/or consecutive manner. The relative displacement of the first and second end effectors 170a, 170b of the first and second component pane handlers 160a, 160b can be determined and controlled by the computer software program (i.e., as set of program instructions) executed by the computing system or device that is coupled to the component pane transfer module 150.

As described above, each of the first component pane handler 160a and the second component pane handler 160b can be coupled to an actuator that effectuates the displacement of the first component pane handler 160a, the second component pane handler 160b, and the first and second end effectors 170a, 170b of the first and second component pane handlers 160a, 160b.

In various embodiments, the end effectors 170 include at least one vacuum or suction module, vent, gap, or opening 190 for aiding retrieval of the component panes 50 from the component pane storage station 100 and/or for securing the component panes 50 to the end effectors 170 during displacement of the end effectors 170. The at least one vacuum or suction module 190 can be located at or proximate to the registration element 180 of the end effector 170. The at least one vacuum or suction module 190 of a particular end effector 170 can be disposed such that vacuum or suction force is applied at or proximate to an edge or perimeter of the component pane 50 being carried by said end effector 170. In various embodiments, vacuum or suction force applied to a particular component pane 50 (e.g., film frame 50) by the at least one vacuum or suction module 190 can be controlled and/or adjusted as desired, for instance depending upon size of component pane 50 and/or speed of displacement of the end effector 170.

In a third process portion 430, the first and second end effectors 170a, 170b of the first and second component pane handlers 160a, 160b are displaced, more specifically rotated, to position the component panes 50a, 50b carried thereby at a desired or target position relative to the pick and place mechanism or arm 250. In many embodiments, the first and second end effectors 170a, 170b of the first and second component pane handlers 160a, 160b are displaced, more specifically rotated, to position the component panes 50a, 50b carried thereby at a desired or target position relative to the alignment module 200. The alignment module 200 can be carried by the pick and place mechanism 250. However, in specific embodiments, the alignment module 200 is indirectly coupled to the pick and place mechanism 250 or disposed adjacent to, proximate to, or near the pick and place mechanism 250.

FIG. 2F and FIG. 2G shows the position of the first and second component panes 50a, 50b relative to the alignment module 200 carried by the pick and place mechanism 250. In many embodiments, in the third process portion 430, the first and second end effectors 170a, 170b of the first and second component pane handlers 160a, 160b are displaced, more specifically rotated, such that the component panes 50a, 50b carried thereby are positioned, more specifically accurately or appropriately positioned, for spatial alignment by the alignment module 200.

In a fourth process portion 440, the first component pane handler 160a, more specifically the end effector 170a of the first component pane handler 160a, is displaced relative to the alignment module 200. The displacement of the end effector 170a relative to the alignment module 200 causes a corresponding displacement of the first component pane 50a coupled thereto relative to the alignment module 200.

More specifically, the first end effector 170a is displaced to or towards the alignment module 200 in the fourth process portion 440. The displacement of the first component pane 50a to or towards the alignment module 200 can effectuate contact between the first component pane 50a and the alignment module 200. Contact between the first component pane 50a and the alignment modules 200 can result in an application of force (e.g., contact, push, or a small impact force) against or onto particular portion(s) of the periphery (e.g. one or more contact points), edge, side, or extremity of the first component frame 50a by the alignment module 200.

In multiple embodiments, the first component pane 50a can be displaced relative to the alignment module 200 in a manner such that force applied onto the first component pane 50a pushes the first component pane 50*a* against the registration element 180 of the first end effector 170*a*. More specifically, the first component pane 50*a* can be displaced relative to the alignment module 200 in a manner such that force applied onto particular portion(s) of the periphery, edge, side, or extremity of the first component pane 50*a* effectuates or enhances engagement between the registration groove(s) 60 of the first component pane 50*a* and the registration element 180 of the first end effector 170*a*.

The engagement or enhanced engagement effectuated between the first component pane 50*a*, more specifically the registration groove(s) 60 of the first component pane 50*a*, and the registration element 180 of the first end effector 170*a* facilitates or effectuates spatial alignment, or at least substantial spatial alignment, of the first component pane 50*a*. In many embodiments, the engagement or enhanced engagement between the first component pane 50*a* and the registration element 180 of the first end effector 170*a* effectuates spatial alignment of the first component pane 50*a* in a manner that removes a need for further spatial alignment or substantial spatial alignment of the first component pane 50*a*.

As described above, the alignment module 200 can include a spring-loaded mechanism (or a tensioned element). The spring-loaded mechanism is configured to absorb at least a part of the force associated with contact between the film panes 50 (e.g., the first and second component panes 50*a*, 50*b*) and the alignment module 200. In several embodiments, the spring-loaded mechanism is configured to reduce, prevent, or eliminate deformation or damage to the component panes 50, e.g., the first and second component panes 50*a*, 50*b*, due to excess force (e.g., excess, unwanted, or unintended contact or push force) applied to the component panes 50 by the alignment module 200. In many embodiments, the alignment module 200 can include two or more spring-loaded mechanisms or elements.

FIG. 2H shows the displacement of the first end effector 170*a*, and the first component pane 50*a* carried thereby, relative to the alignment module 200 carried by the pick and place mechanism 250 such that particular portion(s) of the periphery, edge, side, or extremity of the first component pane 50*a* comes into contact with the alignment module 200.

The alignment module 200 can push against the periphery, edge, side, or extremity of the first component pane 50*a* and effectuates or enhances engagement between the first component pane 50*a* and the registration element 180 of the first end effector 170*a* to thereby effectuate spatial alignment of the first component pane 50*a* in a manner that removes a need for any further spatial alignment of first component pane 50*a* (i.e., in a manner that satisfies alignment requirements for subsequent processing or inspections processes).

Although in many embodiments of the present disclosure the alignment of film frames 50 is facilitated or effectuated using the alignment module 200 in the fourth process portion 440, it will be understood that in particular embodiments, the alignment of film frames 50 can be facilitated or effectuated upon, during, or after retrieval of the film frames 50 by the end effector 170, for instance upon engagement between the registration groove(s) or marker(s) 60 of the film frame 50 and the registration element 180 of the end effector 170 at the film frame loading station 100. As described above, the movement or translation of the end effector 170 can be controlled such that alignment of film frames 50 can be facilitated or effectuated upon, during, or after retrieval of the film frames 50 by the end effector 170, for instance upon engagement between the registration groove(s) or marker(s) 60 of the film frame 50 and the registration element 180 of the end effector 170 at the film frame loading station 100.

In a fifth process portion 450, the first component pane 50*a* is transferred from the first component pane handler 160*a*, more specifically the first end effector 170*a*, to the pick and place mechanism 250 as shown in FIG. 2I and FIG. 2J.

In many embodiments, in the fifth process portion 450, the first end effector 170*a* is displaced for positioning the first component pane 50*a* carried thereby underneath the pick and place mechanism 250. More specifically, the end effector 170*a* can be displaced to align the first component pane 50*a* relative to the at least one suction element 260 of the pick and place mechanism 250. Alignment of the first component pane 50*a* relative to the at least one suction element 260 of the pick and place mechanism 250 can help to ensure accurate transfer of the first component pane 50*a* from the first end effector 170*a* to the pick and place mechanism 250.

Each of the end effectors 170*a*, 170*b* and the pick and place mechanism 250 is configured for x-axis, y-axis, z-axis, and/or θ-axis motion or displacement. In several embodiments, the first end effector 170*a* and the pick and place mechanism 250 are displaced relative to each other along the z-axis (i.e., vertically) for facilitating the transfer of the first component pane 50*a* from the first end effector 170*a* to the pick and place mechanism 250.

In some embodiments, the pick and place mechanism 250 is displaced along the z-axis (i.e., vertically displaced) towards the first end effector 170*a*, more specifically the first component pane 50*a* carried by the first end effector 170*a*, to facilitate or effectuate pick up or retrieval of the first component pane 50*a* from the end effector 170*a*. In other embodiments, the first end effector 170*a* is displaced along the z-axis towards the pick and place mechanism 250 to facilitate pick up or retrieval of the first component pane 50*a* from the first end effector 170*a* by the pick and place mechanism 250.

As described above, the pick and place mechanism 250 includes the at least one suction element 260 configured to apply or provide a suction or vacuum force for facilitating or effectuating pick up of the component panes 50 (e.g., the first component pane 50*a*, and in a representative implementation the first film frame 50*a*) from the end effectors 170. The use of suction or vacuum force for picking up the component panes 50 from the end effectors 170 enables lifting of the component panes 50 from a surface of the end effectors 170 during pick up or retrieval of the component panes 50 from the end effectors 170. The suction or vacuum force applied by the at least one suction elements 260 to the component pane 50 can be controlled and/or adjusted, for instance depending upon size of the component pane 50 to be picked up by the pick and place mechanism 250 and/or speed of displacement of the pick and place mechanism 250. The at least one suction element can be displaced to different predetermined positions to thereby enable pick up of component pane(s) 50 (e.g., film frames 50) of different sizes.

In several embodiments, the pick and place mechanism 250 includes a plurality of (i.e., at least two) suction elements 260. The plurality of suction elements 260 can be displaced and positioned at different positions relative to each other to enable the pick up or retrieval of component panes 50 (e.g., film frames 50) of different sizes from the end effectors 170 of the component frame handlers 160. As described above, in particular embodiments, the pick and place mechanism 250 can include at least one movable arm, each movable arm of the at least one movable arm carrying at least one suction element 260. Each movable arm can be displaced for displacement and positioning the at least one suction element 260 carried thereby towards a target or intended position. Alternatively, or additionally, the at least one suction element 260 carried by each movable arm can be displaced along said movable arm to be positioned at the target or intended positions relative to other suction element(s) 260 carried by another movable arm of the pick and place mechanism 250.

The ability of the suction elements 260 of the pick and place mechanism 250 to be displaced and positioned at different positions relative to each other enables the suction elements 260, and hence the pick and place mechanism 250, to pick up or retrieve component frames 50 (e.g., film frames 50) of different sizes. The ability of the pick and place mechanism 250 to pick up or retrieve component panes 50 (e.g., film frames 50) of different sizes removes a need to substitute pick and place mechanisms for allowing handling and/or transfer component panes 50 (e.g., film frames) of different sizes as is required with many existing film frame handling and/or transfer systems. Therefore, the system 20 of various embodiments of the present disclosure is more versatile, convenient, and cost effective to operate.

In a sixth process portion 460, the first component pane 50a (e.g., first film frame 50a) is transferred by the pick and place mechanism 250 to the vacuum table assembly 300, more specifically to the vacuum table 310 of the vacuum table assembly 300. FIG. 2K shows transfer and position of the first component pane 50a on the vacuum table 310.

The pick and place mechanism 250 is displaceable (e.g., translatable) for positioning the first component pane 50a carried thereby at a desired or target position relative to the vacuum table 310. For instance, the pick and place mechanism 250 can be displaced for positioning the first component pane 50a above the vacuum table 310.

Once the first component pane 50a is placed above the vacuum table 310, the pick and place mechanism 250 can then be vertically displaced, for instance vertically displaced downwards, for displacing the first component pane 50a carried thereby towards the vacuum table 310. In multiple embodiments, the pick and place mechanism 250 is vertically displaceable for placing the first component pane 50a onto the vacuum table 310. Suction force applied to the first component pane 50a by the set of suction elements 180 can be reduced, substantially reduced, dis-applied or stopped, for facilitating or effectuating release of the first component pane 50a onto the vacuum table 310.

In many embodiments, the release of the component panes 50 (e.g., film frames 50) onto the vacuum table 310 by reducing, substantially reducing, or ceasing application of suction or vacuum force applied onto the component panes 50 (e.g., film frames 50) removes a conventional need for a vacuum table to include ejector pins for accepting component panes 50 (e.g., film frames 50) thereonto. The removal of the need for vacuum tables to utilize ejector pins for component pane 50 (e.g., film frame 50) receipt or acceptance thereonto helps to reduce manufacturing cost of the vacuum table and/or increase ease, efficiency, and safety of transferring component panes 50 (e.g., film frames 50) onto vacuum tables.

In a seventh process portion 470, the vacuum table 310 is translated for displacing or translating the first component pane 50a carried thereby to the inspection apparatus 350 (e.g., film frame inspection apparatus or component pane inspection apparatus) as shown in FIG. 2L.

The translation of the vacuum table 310 can be effectuated by the vacuum table translation mechanism 320 coupled to the vacuum table 310. The vacuum table translation mechanism 320 can be configured to enable one or more of x-, y-, z-, and θ-axis motion or displacement of the vacuum table 310.

An eighth process portion 480 involves inspection of the first component pane 50a (e.g., the first film frame 50a) by the inspection apparatus 350. The inspection apparatus 350 can be an optical inspection apparatus configured to capture images of film frames 50 and any component(s) carried thereby, or portions thereof. The inspection apparatus 350 can alternatively or additionally be configured to capture images of other component panes and component frames 50 such as solar wafer panels, or portions thereof. The captured images of the component panes 50, or portions thereof, can be transmitted to a computer system or device coupled to the optical inspection apparatus. The captured images of the component panes 50 (e.g., film frames 50) and any component(s) carried thereby, or portions thereof, can be stored and/or processed by the computer system. The processing of captured images of the component panes 50 (e.g., film frames 50) and any component(s) carried thereby, or portions thereof, can aid detection of any defects present on the surface of the component panes 50 (e.g., film frames 50) and any component(s) carried thereby 50.

After the inspection of the first component pane 50a (e.g., first film frames 50a) and any component(s) carried thereby, the first component pane 50a (e.g., first film frames 50a) and any component(s) carried thereby is then transferred from the vacuum table 310 to the component pane offloading interface (e.g., film frame offloading interface) in a ninth process portion 490. The component pane offloading interface (e.g., film frame offloading interface) can be a part of the component pane storage station 100 (e.g., film frame uploading station 100). Alternatively, the component pane offloading interface (e.g., film frame offloading interface) can be a separate system element, structure, or unit as compared to the component pane storage station 100 or film frame uploading station 100.

The transfer of the first component pane 50a (e.g., first film frame 50a) from the vacuum table 310 to the component pane offloading interface (e.g., film frame offloading interface such as a film frame cassette or rack) is depicted from FIG. 2P to FIG. 2U.

In many embodiments, the ninth process portion 490 involves pick up or retrieval of the first component pane 50a (e.g., the first film frame 50a) from the vacuum table 310 by the pick and place mechanism 250. The pick up or retrieval of the first component pane 50a from the vacuum table 310 can be effectuated by application of suction force by the at least one suction element 260 of the pick and place mechanism 250.

The use of suction force by the pick and place mechanism 250 to pick up or retrieve component panes 50 from the vacuum table 310 removes or eliminates a conventional or existing need for use of ejector pins to eject or lift component panes or component frames (e.g., film frames or solar wafer panels) a distance from conventional vacuum tables to thereby allow a conventional component pane handler to pick up or retrieve component panes or component frames from said conventional vacuum tables. In addition, during pick up or retrieval of the component panes 50 from the vacuum table 310, the vacuum force applied onto the surface of the component pane 50 will substantially be reduced, dis-applied or stopped, for facilitating or effectuating release of the component pane 50 such that the pick and place mechanism 250 can easily pick up the component pane 50 without inherently damaging the component pane 50.

The system 20 of many embodiments of the present disclosure, more specifically the vacuum table 310 of the system 20, can omit ejector pins, or like pins, elements, or mechanisms of a similar function. The absence of ejector pins with the system 20 of various embodiments of the present disclosure decreases complexity and/or cost of manufacture and/or operation of the system 20.

The ninth process portion 490 also involves transfer of the first component pane 50a (e.g., first film frame 50a) from the pick and place mechanism 250 to the first component pane handler 160a, more specifically to the first end effector 170a of the first component pane handler 160a. Suction force can be continuously applied to the first component pane 50a to hold, couple, or secure the first component pane 50a to the pick and place mechanism 250 during transfer of the first component pane 50a from the vacuum table 310 to the first end effector 170a of the first component pane handler 160a. For releasing the first component pane 50a onto the first end effector 170a of the first component pane handler 160a, the suction force applied to the first component pane 50a by the set of vacuum or suction elements 260 of the pick and place mechanism 250 can be reduced, substantially reduced, or stopped.

The first end effector 170a of the first component pane handler 160a carrying the first component pane 50a can then be rotated and/or displaced for transferring the first component pane 50a to the component pane offloading interface.

As described above, in most embodiments, the system 20 includes multiple component pane handlers 160 (e.g., film frame handlers 160) for handling and/or transferring component frames 50 (e.g., film frames 50). For instance, the system 20 can include the first component pane handler 160a (e.g., first film frame handler 160a) and the second component pane handler 160b (e.g., second film frame handler 160b). The use of multiple component pane handlers 160 for handling and/or transferring component panes 50 can help to increase efficiency and/or throughput of the system 20. Conventional systems for handling component panes or component frames that only include one component pane handler for handling and/or transferring component panes are generally associated with a lower throughput and efficiency.

In many embodiments, after the first component pane 50a (e.g., first film frame 50a) and any component(s) carried thereby is being inspected, the first component pane 50a (e.g., first film frame 50a) is transferred or removed from the pick and place mechanism 250 back to the first component pane handler 160a or film frame handler 160a, the second component pane 50b (e.g., second film frame 50b) carried by the second end effector 170b of the second component pane handler 160b can then be transferred to the pick and place mechanism 250 for transfer to the vacuum table assembly 300.

The transfer of the second component pane 50b from the second end effector 170b of the second component pane handler 160b to the pick and place mechanism 250 can occur immediately, or substantially immediately, after removal of the first component pane 50a from the pick and place mechanism 250. Accordingly, operation or use of the pick and place mechanism 250 can be optimized. In other words, the length of down-time (or time at which the pick and place mechanism 250 is idling or not being used to handle and/or transfer component panes 50 (e.g., film frames 50) can be reduced.

The use of multiple component pane handlers 160 (e.g., at least the first and second component pane handlers 160a, 160b) can increase the speed or efficiency at which component panes 50 (e.g., film frames 50) are transferred to and from the pick and place mechanism 250. Therefore, the use of multiple component pane handlers 160 can increase efficiency and/or throughput of the system 20.

In many embodiments, the configuration and/or the operation of the second component pane handler 160b, and the second end effector 170b of the second component pane handler 160b, is similar or substantially similar to the configuration and/or the operation of the first component pane handler 160a, and the first end effector 170a of the first component pane handler 160a.

As with the first component pane 50a, the second component pane 50b can also be aligned (e.g., spatially aligned) prior to transfer of the second component pane 50b to the vacuum table assembly 300, more specifically to the vacuum table 310 of the vacuum table assembly 300. In addition, in many embodiments, as with the first component pane 50a, the second component pane 50b is spatially aligned prior to transfer of the second component pane 50b from the second end effector 170b to the pick and place mechanism 250.

The spatial alignment of the second component pane 50b (e.g., the second film frame 50b) carried by the second end effector 170b of the second component pane handler 160b can be effectuated in a tenth process portion 500. The spatial alignment of the second component pane 50b can be effectuated in a similar, or substantially similar, manner as compared to the spatial alignment of the first component pane 50a in the fourth process portion 440.

In many embodiments, spatial alignment of the second component pane 50b (i.e., the tenth process portion 500) involves displacement of the end effector 170b of the second component pane handler 160b (also referred to as the second end effector 170b), and correspondingly the second component pane 50b carried by the end effector 170b, relative to the alignment module 200.

The second end effector 170b of the second component pane handler 160b can be aligned, for example vertically aligned to be along a same plane, with the alignment module or alignment element or position alignment module 200 prior to displacement of the second end effector 170b relative to the alignment module 200. In other words, at least one of the second end effector 170b and the pick and place mechanism 250 can be displaced in the z-axis to bring the second component pane 50b carried by the second end effector 170b into vertical alignment (i.e., along the same plane) with the position alignment module 200.

The displacement of the second end effector 170b to or towards the alignment module 200, and correspondingly the displacement of the second component pane 50b to or towards the alignment module 200, effectuates contact between the second component pane 50b and the alignment module 200. In several embodiments, the displacement of the second end effector 170b to or towards to the alignment module 200 displaces the second component pane 50b to or towards the alignment module 200 in a manner that results in a force applied to or against particular portion(s) of the periphery, side, edge, or extremity of the second component pane 50b by the alignment module 200.

The application of force by the alignment element 200 to particular portion(s) of the periphery, side, edge, or extremity of the second component pane 50b can effectuate or enhance engagement between the second component pane 50b, more specifically the registration groove(s) 60 of the second component pane 50b, and the registration element 180 of the second end effector 170b. Effectuation or enhancement of engagement between the second component pane 50b, more specifically the registration groove(s) 60 of the second component pane 50b, and the registration element 180 of the second end effector 170b can facilitate or effectuate spatial alignment of the second component pane 50b in a manner that removes a need for further spatial alignment of the second component pane 50b.

In an eleventh process portion 510, the spatially aligned second component pane 50b (e.g., second film frame 50b) is transferred from the second end effector 170b of the second component pane handler 160b to the pick and place mechanism 250. In most embodiments, the transfer of the second component pane 50b from the end effector 170b to the pick and place mechanism 250 occurs in a similar, or substantially similar, manner as compared to the transfer of the first component pane 50a from the first end effector 170a to the pick and place mechanism 250.

Where the first and second component panes 50a, 50b are of the same size, the at least one suction element 260 of the pick and place mechanism 250 need not be displaced between handling of the first and second component panes 50a, 50b. This means that where the first and second component panes 50a, 50b are of the same size, the position of the at least one suction element 260 of the pick and place mechanism 250 does not need to be varied or adjusted between handling of the first and second component panes 50a, 50b. However, when the second component pane 50b is of a different size as compared to the first component pane 50a, the at least one suction element 260 of the pick and place mechanism 250 can be displaced and positioned at a different predetermined position to thereby allow or enable the pick up or retrieval of the different sized second component pane 50b.

In a twelfth process portion 520, the second component pane 50b (e.g., second film frame 50b) is transferred by the pick and place mechanism 250 to the vacuum table assembly 300, more specifically to the vacuum table 310 of the vacuum table assembly 300. The transfer of the second component pane 50b from the pick and place mechanism 250 onto the vacuum table 310 occurs in a similar or substantially similar manner as compared to the transfer of the first component pane 50a from the pick and place mechanism 250 onto the vacuum table 310.

The use of vacuum for transferring the second component pane 50b onto the vacuum table 310 removes the need for ejector pins as required with conventional vacuum tables. In addition, the use of suction or vacuum pads 180 are that position adjustable allows for transfer of component panes 50 (e.g., film frames 50) of different sizes onto the vacuum table. Conventional vacuum tables would require multiple sets of ejectors pins, each set of ejector pins for receiving component panes (e.g., film frames and film frames together with any component(s) carried thereby) of one particular size, to enable receipt of component panes (e.g., film frames and film frames together with any component(s) carried thereby) of multiple sizes onto said conventional vacuum tables. Accordingly, the system 20 of multiple embodiments of the present disclosure is more versatile, cost effective, and efficient as compared to many conventional systems for handling, transferring, and aligning component panes (e.g., film frames).

In a thirteenth process portion 530, the vacuum table 310 is translated (e.g., in at least one of a x-axis, y-axis, z-axis, and θ-axis direction) for translating or displacing the second component panes 50b or film frames 50b and any component(s) carried thereby relative to, more specifically to or towards, the inspection apparatus 350 for facilitating inspection of the second component panes 50b or film frames 50b and any component(s) carried thereby by the inspection apparatus 350. The vacuum table 310 can be translated or displaced across a predetermined plurality of predetermined inspection positions (e.g., image capture positions), at which the second component panes 50b or film frames 50b and any component (s) carried thereby 50b can be inspected (e.g., at which images of the second component panes 50b or film frames 50b and any component(s) carried thereby 50b can be captured.

FIG. 2R to FIG. 2Y shows the transfer of the second component pane 50b (e.g., second film frame 50b) from the second end effector 170b to the pick and place mechanism 250; subsequent transfer of the second component pane 50b (e.g., second film frames 50b) from the pick and place mechanism 250 onto the vacuum table 310; and the translation or displacement of the vacuum table 310, and hence displacement of the second component pane 50b (e.g., second film frames 50b) to or towards the inspection apparatus 350.

As shown in FIG. 2R to FIG. 2Y, the pick up of the second component pane 50b (e.g., second film frame 50b) by the pick and place mechanism 250; transfer of the second component pane 50b from the pick and place mechanism 250 to the vacuum table 310; and translation or displacement of the vacuum table 310 and second component pane 50b carried thereby to the inspection apparatus 350 coincides, or occurs simultaneously or concurrently, with a fourteenth process portion 540 that includes an offloading of the first component pane 50a from the first end effector 170a to the component pane offloading interface and a retrieval of a next (i.e., third) component pane 50c from the component pane storage station 100 (e.g., film frame storage station 100).

While the second component pane handler 160b and the second end effector 170b is waiting to receive the second component pane 50b subsequent the inspection of the first component pane 50a, the first component pane handler 160a and the first end effector 170a are working or operating (e.g., being displaced) to retrieve the next (i.e., third) component pane 50c (e.g., third film frame 50c) from the component pane storage station 100 or the film frame loading station. In such a manner, the third component pane 50c can be ready for alignment using the alignment module 200; and transfer to the pick and place mechanism 250 immediately, or substantially immediately, upon transfer or removal of the second component pane 50b from the pick and place mechanism 250 to the second end effector 170b. The transfer of the second component pane 50b to the vacuum table assembly 300 for inspection by the inspection apparatus 350 coincides, or occurs at least partially simultaneously or concurrently with, a transfer or offloading of the first component pane 50a to the component pane offloading interface and retrieval of a next or third component pane 50c from the component pane storage station 100 (e.g., film frame storage station 100).

As will be understood by a person skilled in the art using the above disclosure, the use of multiple component pane handlers 160 or film frame handlers 160 (e.g., at least the first and second component pane handlers 160a, 160b or at least the first and second film frame handlers 160a, 160b) and corresponding multiple end effectors 170 (e.g., at least the first and second end effectors 170a, 170b) can increase the efficiency and/or throughput of the system 20. The use of multiple component frame handlers 160 and end effectors 170 enables a subsequent or next component frame 50 (e.g., film frame 50), for instance the second or third component frame 50b, 50c, to be positioned for immediate or substantially immediate alignment by the position alignment module 200 and/or pick up by the pick and place mechanism 250 upon removal of a previous component frame 50, for instance the first or second component frame 50a, 50b respectively, from the pick and place mechanism 250.

In addition, in several embodiments, the component pane (e.g., film frame) spatial alignment by the alignment module 200 is easy, efficient, and/or simple. The carrying or coupling of the alignment module 200 to the pick and place mechanism 250 removes a need for a separate or standalone system element or structure for effectuating spatial alignment of component frames 50 (e.g., film frames 50), which can increase the complexity and cost of manufacturing said system 20. In addition, in multiple embodiments, the alignment module 200 is positioned at or proximate a side, edge, or periphery of the pick and place mechanism 250, thereby facilitating easy, convenient, and/or unrestricted access of component panes 50 (e.g., film frames 50) thereto.

A simple relative displacement between a particular component pane 50 and the alignment module 200 can result in application of a force to or against particular portions of the periphery, side, edge, or extremity of said component pane 50 (e.g., film frame 50) and effectuate or enhance engagement between said component pane 50 (or registration groove(s) 60 of said component pane 50) and the registration element 180 of the end effector 170 carrying said component pane 50 to thereby effectuate spatial alignment of the component pane 50. The one of effectuation and enhancement between said component pane 50 (or registration groove(s) 60 of said component pane 50) and the registration element 180 of the end effector 170 carried said component pane 50 can effectuate spatial alignment of said component pane 50 in a manner that removes a need for further spatial alignment of said component pane 50 relative to the vacuum table 310. Furthermore, in particular embodiments, the one of effectuation and enhancement between said component pane 50 (or registration groove(s) 60 of said component pane 50) and the registration element 180 of the end effector 170 carried said component pane 50 can effectuate spatial alignment of said component pane 50 in a manner that removes a need for further spatial alignment of said component pane 50 prior to application of a securing force (e.g., vacuum or suction force) to the component pane 50 for securely retaining the component pane 50 to the vacuum table 310. In several embodiments, the configuration, shape, and/or design of the alignment module 200 is simple such that the alignment module 200 is easy to construct and/or assemble.

Embodiments of the present disclosure relate to systems, devices, apparatus, methods, processes, or techniques for handling and/or transferring component panes or component frames (e.g., film frames). While the description of various embodiments of the present disclosure provide above is related, or substantially related, to film frames, it will be understood that other types of components, for instance other types of semiconductor-related components such as wafers, electrical components such as PCBs, and solar cells or modules or solar panel shaped like a wafer, can also be handled, transferred, and/or aligned by the systems, devices, apparatuses, methods, processes, or techniques of various embodiments of the present disclosure.

The system of many embodiments includes multiple component pane handlers (e.g., film frame handlers) configured to retrieve component panes (e.g., film frames) from the component pane loading/offloading station or the film frame storage station (e.g., film frame loading/offloading station) and transfer the component panes (e.g., film frames) between the component pane loading/offloading station and the pick and place mechanism. The use of multiple component pane handlers to transfer component panes between the component pane loading/offloading station and the pick and place mechanism can help to increase the efficiency of transfer of component panes between the component pane loading/offloading station and the pick and place mechanism.

The system of many embodiments includes the alignment element or module, which can be carried by or coupled to the pick and place mechanism. The alignment element is configured to align (e.g., spatially align) the component pane prior to transfer of the component frame to the vacuum table assembly, more specifically the vacuum table of the vacuum table assembly, or to the pick and place mechanism. In many embodiments, the alignment element is positioned or disposed to facilitate easy, convenient, unrestricted, or at least substantially unrestricted access of component panes (e.g., film frames carried by end effectors) thereto. Components carried by the end effectors of component pane handlers can be displaced relative to the alignment element. Displacement of a particular component frame relative to the alignment element can result in contact between the component pane and the alignment element and application of force to or onto the component pane by the alignment element. Application of force to or onto the component pane, for instance application of a pushing force against a side or edge of the component pane, can effectuate or enhance engagement between the component pane, more specifically the registration groove(s) of the component pane, and the registration element of the end effector. The effectuation or enhancement of engagement between the component pane, more specifically the registration groove(s) of the component pane, and the registration element of the end effector can facilitate or effectuate spatial alignment of the component pane.

The coupling of the alignment element to the pick and place mechanism can contribute to simplification of design of the system. The alignment element can be constructed, configured, and/or positioned relative to other component panes of the system in such a manner as to reduce cost associated with manufacture and/or operation of the system. In addition, the alignment element can be configured, for instance with at least one spring-loaded mechanism, to reduce impact upon contact between the alignment module and the component pane. This will reduce, prevent, or eliminate the possibility of deformation or damage to the component pane upon said contact.

The system of many embodiments is configured such that component panes being handled or transferred thereby are correctly aligned spatially prior to transfer and upon placement thereof on the vacuum table. This removes a need of the vacuum table to carry or include alignment elements, pins, mechanisms, or means. This helps to reduce complexity of system configuration, more specifically the complexity of the vacuum table assembly, and/or cost associated with manufacture and/or operation of the system, more specifically vacuum table assembly.

The pick and place mechanism of many embodiments includes at least one suction element configured to apply a suction or vacuum force to the film frame to thereby hold, couple, or secure the component pane (e.g., film frame) to the pick and place mechanism. Suction or vacuum force applied by the at least one suction element of the pick and place mechanism can effectuate pick up or retrieval of a component pane by the pick and place mechanism, for instance from the component pane handler or the vacuum table. Subsequently, cessation of application of suction or vacuum force by the at least one suction element of the pick and place mechanism effectuates release of the component pane from the pick and place mechanism, for instance onto the vacuum table. The use of suction or vacuum force for picking up a component pane (e.g., film frame) from the vacuum table removes a need for ejector pins for enabling pick up of component panes from the vacuum table as is typically required with many existing vacuum tables. In addition, the at least one suction element of the pick and place mechanism can be variably displaced and positioned at different position to facilitate or enable coupling, holding, and/or securing of component panes of different sizes to the pick and place mechanism.

Particular embodiments of the disclosure are described above for addressing at least one of the previously indicated problems. While features, functions, advantages, and alternatives associated with certain embodiments have been described within the context of those embodiments, other embodiments may also exhibit such advantages, and not all embodiments need necessarily exhibit such advantages to fall within the scope of the disclosure. It will be appreciated that several of the above-disclosed structures, features and functions, or alternatives thereof, may be desirably combined into other different devices, systems, or applications. The above-disclosed structures, features and functions, or alternatives thereof, as well as various presently unforeseen or unanticipated alternatives, modifications, variations or improvements thereto that may be subsequently made by one of ordinary skill in the art, are encompassed by the following claims.

The invention claimed is:

1. A system for handling a component pane comprising:
at least one component pane handler, each component pane handler including an end effector configured to retrieve a component pane from a component pane storage station, the at least one component pane handler coupled to a registration element on the end effector, the registration element on the end effector being configured for fitting engagement with a corresponding set of registration grooves on a component pane carried by the end effector to effect alignment of the component pane; and
an alignment module disposed in a position external to the component pane storage station,
wherein relative displacement of the end effector of each component pane handler of the at least one component pane handler and the alignment module towards one another results in at least a portion of an extremity of a component pane carried by said end effector to contact with the alignment module to effect an application of force onto the component pane to thereby displace the component pane such that the set of registration grooves of the component pane engages with the registration element of the end effector.

2. The system as in claim 1, wherein the at least one component pane handler comprises at least one robotic arm.

3. The system as in claim 2, wherein the system further comprises a vacuum table assembly, the vacuum table having no registration elements, and able to receive a component pane of varying sizes.

4. The system as in claim 3, further comprising a pick and place mechanism configured to capture and transfer the component pane from the end effector and a vacuum table assembly or vice versa.

5. The system as in claim 4, wherein the vacuum table assembly, receiving a component pane, is translatable to position the component pane carried thereby relative to an inspection apparatus for inspection.

6. The system as in claim 4, wherein the pick and place mechanism comprises:
a plurality of displacement arms, each having at least one suction element on its length, the at least one suction element being configured to capture a component pane, the plurality of displacement arms being displaceable between a plurality of sets of pre-determined positions, each set of the plurality of sets of pre-determined positions corresponding to a component pane of different shape and/or size; and
a position control mechanism coupled to the plurality of displacement arms, the position control mechanism being configurable to control a displacement of the plurality of displacement arms to a set of pre-determined positions from amongst the plurality of sets of pre-determined positions, corresponding to the shape and/or size of a component pane being handled,
wherein said displacement of the plurality of displacement arms results in displacement of the at least one suction element to the set of pre-determined positions for capture and handling of the component pane of a corresponding pre-determined shape and/or size.

7. The system as in claim 6, wherein the application, continued application or disapplication of vacuum suction by each of the at least one suction element on each of the plurality of displacement arms of the pick and place mechanism to a surface of a component pane, effects the pick-up, transfer and placement of the component pane between an end effector and the vacuum table respectively.

8. The system as claim 6 or 7, wherein the at least one suction element is displaceable between a plurality of positions along the length of each of the plurality of displacement arms for capture and handling component panes of different shapes and/or sizes.

9. The system as in any of the claims 1-7, wherein the alignment module comprises at least one alignment element configured to facilitate the alignment of the component pane carried by the end effector.

10. The system as in claim 9, wherein the alignment module is spatially disposed at a distance beyond the periphery of a component pane carried by the component pane handler and disposed opposite to the registration element of each component pane handler of the at least one component pane handler.

11. The system as in claim 9, wherein the alignment module comprises at least two alignment elements disposed at a distance from each other, the at least two alignment elements disposable relative to the registration element of the end effector of each component pane handler of at least one component pane handler in a manner to effectuate application of a force to at least two positions along the periphery of a component pane carried by said end effector during relative displacement of the component pane and the alignment module.

12. The system as in claim 11, wherein the at least two alignment elements are positioned such that the at least two positions, along the periphery of the component pane where the at least two alignment elements apply a force, are located substantially opposite a position of engagement between the at least one registration groove of the component pane with the registration element of the end effector.

13. The system as in any of claims 4-7, wherein the alignment module is disposed at a periphery of the pick and place mechanism.

14. The system as in claim 13, wherein the pick and place mechanism includes the alignment module, and wherein the relative displacement between the pick and place mechanism and the end effector results in contact between the periphery of a component pane carried by the end effector and the alignment module to thereby effectuate alignment of the component pane.

15. The system as in claim 13, wherein the alignment module comprises a spring-loaded mechanism configured and positioned to contact with a portion of the periphery of the component pane carried by the end effector of each of the at least one component pane handler to effect the alignment of the component pane when said component pane is displaced towards the alignment module.

16. The system as in claim 15, wherein the spring loaded mechanism is configured to absorb at least part of a force applied to the component pane upon contact between a portion of the periphery of the component pane and the alignment module.

17. The system as in claim 1 wherein the component panes are semiconductor film frames.

18. A method for handling and aligning component panes, wherein aligning component panes comprises:

activation of at least one component pane handler to retrieve a component pane from a component pane storage station, the component pane having registration grooves at its periphery;

retrieving of a component pane from the component pane storage station;

displacing each end effector of a plurality of end effectors in a controlled sequential manner relative to an alignment module located external to the component pane storage station, the displacement of each end effector of the plurality of end effectors correspondingly displacing the component pane carried thereby relative to the alignment module; and application of a force by the alignment module onto the component pane carried by each end effector of the plurality of end effectors to thereby effectuate the fitting engagement of said component pane to the registration element of said end effector to effect alignment of component pane, without the need for further spatial alignment of said component pane relative to a vacuum table.

19. The method as in claim 18, further comprising translating the component pane handler having the end effector carrying the component pane thereon towards the alignment module thereby effectuating alignment between at least one registration groove of the component pane and the registration element of the end effector.

20. The method as in claim 18, further comprising translating a pick and place mechanism having the alignment module towards the end effector carrying the component pane thereby effectuating alignment between at least one registration groove of the component pane and the registration element of the end effector.

21. The method as in claim 19 or 20, further comprising providing relative displacement between the component pane handler having the end handler and the pick and place mechanism such that a component pane held by the end effector is positioned for pick up by the pick and place mechanism after alignment of the component pane.

22. The method as in claim 21, wherein the application, continued application and disapplication of the suction force by the plurality of suction elements of each of the plurality of displacement arms of the pick and place mechanism effectuates, the pick up, securing of the component pane to the pick and place mechanism during transferring of the component pane to and from a vacuum table and the displacement of the component pane from a vacuum table.

23. The method as in claim 22, further comprising:
positioning the pick and place mechanism relative to a component pane on a the vacuum table after performance of an inspection process, picking up the inspected component pane using the pick and place mechanism;

providing relative displacement between the component pane handler having the end effector and the pick and place mechanism such that the pick and place mechanism is displaced and positioned to displace the inspected component pane onto the end effector; and displacing the component pane handler to return the inspected component pane into slots of a component pane storage station.

24. The method as in claim 18, wherein displacement of each end effector relative to a pick and place mechanism is controlled by software executable by a computing device.

25. The system as in claim 11, wherein the alignment module is disposed at a periphery of the pick and place mechanism.

26. The system as in claim 12, wherein the alignment module is disposed at a periphery of the pick and place mechanism.

* * * * *